(12) United States Patent
Lerner et al.

(10) Patent No.: US 10,712,369 B2
(45) Date of Patent: Jul. 14, 2020

(54) CURRENT MEASUREMENT USING MAGNETIC SENSORS AND CONTOUR INTERVALS

(71) Applicant: Analog Devices Global Unlimited Company, Hamilton (BM)

(72) Inventors: Boris Lerner, Sharon, MA (US); Yogesh Jayaraman Sharma, Santa Clara, CA (US); Sefa Demirtas, Winchester, MA (US); Jochen Schmitt, Biedenkopf (DE); Paul Blanchard, Westford, MA (US); Arthur J. Kalb, Santa Clara, CA (US); Harvey Weinberg, Sharon, MA (US); Jonathan Ephraim David Hurwitz, Edinburgh (GB)

(73) Assignee: ANALOG DEVICES GLOBAL UNLIMTED COMPANY, Hamilton (BM)

( * ) Notice: Subject to any disclaimer, the term of this patent is extended or adjusted under 35 U.S.C. 154(b) by 114 days.

(21) Appl. No.: 16/003,701

(22) Filed: Jun. 8, 2018

(65) Prior Publication Data
US 2019/0293689 A1    Sep. 26, 2019

Related U.S. Application Data

(60) Provisional application No. 62/647,044, filed on Mar. 23, 2018.

(51) Int. Cl.
*G01R 15/20* (2006.01)
*G01R 33/09* (2006.01)
*G01R 33/07* (2006.01)

(52) U.S. Cl.
CPC ........... *G01R 15/205* (2013.01); *G01R 15/20* (2013.01); *G01R 15/202* (2013.01);
(Continued)

(58) Field of Classification Search
CPC combination set(s) only.
See application file for complete search history.

(56) References Cited

U.S. PATENT DOCUMENTS

| 5,422,566 | A | 6/1995 | Boenning |
| 5,473,244 | A | 12/1995 | Libove et al. |

(Continued)

FOREIGN PATENT DOCUMENTS

| CN | 103487632 A | 1/2014 |
| DE | 102015100924 | 6/2016 |

(Continued)

OTHER PUBLICATIONS

International Search Report and Written Opinion issued in International Patent Application Serial No. PCT/2018/080684 dated Feb. 22, 2019, 20 pages.

(Continued)

*Primary Examiner* — Jay Patidar
(74) *Attorney, Agent, or Firm* — Patent Capital Group

(57) ABSTRACT

Embodiments of the present disclosure provide mechanisms for measuring currents flowing in one or more conductor wires. The mechanisms are based on using magnetic sensor pairs arranged within a housing with an opening for the wires, where each magnetic sensor pair can generate a pair of signals indicative of magnetic fields in two different directions. The outputs of the sensor pairs can be used to derive a measure of current(s) flowing through the one or more wires. The use of magnetic sensor pairs that can measure magnetic field in two different directions may enable simultaneous current measurement in multiple wires placed within the opening, improve accuracy of current measurements while relaxing requirements for precise con- (Continued)

trol of the placement of the wire(s), reduce the impact of stray magnetic interference, and enable both AC and DC measurements.

25 Claims, 16 Drawing Sheets

(52) U.S. Cl.
    CPC ......... *G01R 33/072* (2013.01); *G01R 33/091* (2013.01); *G01R 33/096* (2013.01)

(56) References Cited

U.S. PATENT DOCUMENTS

| | | | |
|---|---|---|---|
| 5,717,326 | A | 2/1998 | Moriwaki |
| 5,767,668 | A | 6/1998 | Durand |
| 6,252,389 | B1 | 6/2001 | Baba et al. |
| 6,411,078 | B1 | 6/2002 | Nakagawa et al. |
| 6,731,105 | B1 | 5/2004 | Hoyle et al. |
| 6,822,443 | B1 | 11/2004 | Dogaru |
| 7,164,263 | B2 | 1/2007 | Yakymyshyn et al. |
| 7,719,258 | B2 | 5/2010 | Chen et al. |
| 8,258,776 | B2 | 9/2012 | Koss et al. |
| 8,400,138 | B2 | 3/2013 | Cooper et al. |
| 8,818,749 | B2 | 8/2014 | Friedrich et al. |
| 8,922,194 | B2 | 12/2014 | Blake et al. |
| 9,063,184 | B2 | 6/2015 | Carpenter et al. |
| 9,151,807 | B2 | 10/2015 | Friedrich et al. |
| 9,689,903 | B2 | 6/2017 | Sharma et al. |
| 2003/0112006 | A1 | 6/2003 | Luetzow |
| 2005/0156587 | A1 | 7/2005 | Yakymyshyn et al. |
| 2006/0261801 | A1 | 11/2006 | Busch |
| 2007/0063690 | A1 | 3/2007 | De Wilde et al. |
| 2008/0077336 | A1 | 3/2008 | Fernandes |
| 2009/0108841 | A1* | 4/2009 | Abe ................. G01C 17/38 324/252 |
| 2011/0248711 | A1 | 10/2011 | Ausserlechner |
| 2012/0187937 | A1 | 7/2012 | Blake et al. |
| 2012/0290240 | A1 | 11/2012 | Fukui |
| 2013/0033260 | A1 | 2/2013 | Nomura et al. |
| 2013/0076343 | A1 | 3/2013 | Carpenter et al. |
| 2013/0106400 | A1 | 5/2013 | Cheng et al. |
| 2013/0162245 | A1 | 6/2013 | Tamura |
| 2013/0285825 | A1 | 10/2013 | Peczalski |
| 2014/0028308 | A1 | 1/2014 | Ogomi et al. |
| 2014/0247044 | A1 | 9/2014 | Mitsuya |
| 2014/0347036 | A1 | 11/2014 | Noh |
| 2015/0016006 | A1 | 1/2015 | Van Vroonhoven et al. |
| 2015/0042320 | A1 | 2/2015 | Cadugan et al. |
| 2015/0142376 | A1* | 5/2015 | Ausserlechner ....... G01D 5/145 702/151 |
| 2015/0316623 | A1 | 11/2015 | Romero |
| 2015/0331072 | A1 | 11/2015 | Ogawa et al. |
| 2015/0338473 | A1 | 11/2015 | Diaconu |
| 2016/0047846 | A1 | 2/2016 | Sharma et al. |
| 2017/0184635 | A1 | 6/2017 | Ugge et al. |
| 2019/0293689 | A1 | 9/2019 | Lerner et al. |

FOREIGN PATENT DOCUMENTS

| | | |
|---|---|---|
| EP | 1 037 056 A1 | 9/2000 |
| EP | 2 202 527 A1 | 6/2010 |
| EP | 2776853 | 9/2014 |
| EP | 3 248 019 * | 3/2019 .......... G01R 15/205 |
| JP | H 09-308615 A | 12/1997 |
| JP | 3681483 B2 | 8/2005 |
| JP | 2012-098205 A | 5/2012 |
| WO | WO 2011/154157 A1 | 12/2011 |
| WO | WO 2013/099504 A1 | 7/2013 |
| WO | 2015/144541 | 10/2015 |
| WO | 2016/116315 | 7/2016 |
| WO | 2019/096674 | 5/2019 |

OTHER PUBLICATIONS

Machine Translation of JP3681483B2.
U.S. Appl. No. 15/812,849, filed Nov. 14, 2017, Current Measuring Apparatus and Methods.
Office Action issued in U.S. Appl. No. 15/812,849 dated Nov. 26, 2019, 35 pages.
Michael J. Haji-Sheikh, *Commercial Magnetic Sensors (Hall and Anisotropic Magnetoresistors)*, © Springer-Verlag Berlin Heidelberg 2008, 22 pages.
Helena G. Ramos et al., *Present and Future Impact of Magnetic Sensors in NDE*, Procedia Engineering 86 (2014), 1st International Conference on Structural Integrity, ICONS-2014, 14 pages.
Lisa Jogschies et al., *Recent Developments of Magnetoresistive Sensors for Industrial Applications*, Sensors 2015, 15, 28665-28689; doi:10.3390/s151128665, www.mdpi.com/journal/sensors, 25 pages.
Pavel Mlejnek et al., *AMR Yokeless Current Sensor with Improved Accuracy*, Procedia Engineering 168 (2016), 30th Eurosensors Conference, Eurosensors 2016, www.elsevier.com/locate/procedia, 4 pages.
Hao Yu et al., *Circular Array of Magnetic Sensors for Current Measurement: Analysis for Error Caused by Position of Conductor*, Sensors 2018, 18, 578; doi:10.3390/s18020578, www.mdpi.com/journal/sensors, 12 pages.
Honeywell, *1- and 2-Axis Magnetic Sensors HMC1001/1002/1021/1022*, Aug. 2008, www.honeywell.com/magneticsensors, 15 pages.
Honeywell, *3-Axis Magnetic Sensor*, HMC1023, Solid State Electronics Center, www.magneticsensors.com, Oct. 2013, 7 pages.
Honeywell, *1, 2 and 3 Axis Magnetic Sensors HMC1051/HMC1052/HMC1053*, Mar. 2006, www.honeywell.com/magneticsensors, 12 pages.
International Search Report and Written Opinion issued in International Patent Application Serial No. PCT/EP2019/056734 dated May 31, 2019, 14 pages.
Unpublished U.S. Appl. No. 15/812,849, filed Nov. 14, 2017.
Rogowski Coil, Wikipedia Entry, http://en.wikipedia.org/wiki/Rogowski_coil (accessed Nov. 14, 2014), 5 pages.
Kaine-Krolak, "An Introduction to Infrared Technology: Applications in the Home, Classroom, Workplace, and Beyond . . . ", 1995, trace.wisc.edu.
English Translation (Description and Abstract) of JP2012-098205 A, 8 pages.
English Translation (Description and Abstract) of JPH 09-308615 A, 15 pages.
English Translation (Description and Abstract) of CN 103487632 A, 4 pages.
Samplón-Chalmeta et al., *A Novel Calibration Method for Ampere's Law-Based Current Measuring Instruments*, IEEE Transactions on Instrumentation and Measurement, vol. 64, No. 3, Mar. 2015, 8 pages.

* cited by examiner

Levenberg–Marquardt method begin
$k := 0; \quad \nu := 2; \quad x := x_0$
$A := J(x)^T J(x); \quad g := J(x)^T f(x)$
$found := (\|g\|_\infty \le \varepsilon_1); \quad \mu := \tau * \max(a_{ii})$
while (not $found$) and ($k < k_{max}$)
 $k := k+1;$ Solve $(A + \mu I)h_{lm} := -g$
 if $\|h_{lm}\| \le \varepsilon_2(\|x\| + \varepsilon_2)$
  $found := $ true
 else
  $x_{new} := x + h_{lm}$
  $\varrho := (F(x) - F(x_{new}))/(L(0) - L(h_{lm}))$
  if $\varrho > 0$  (step acceptable)
   $x := x_{new}$
   $A := J(x)^T J(x); \quad g := J(x)^T f(x)$
   $found := (\|g\|_\infty \le \varepsilon_1)$
   $\mu := \mu * \max\{\frac{1}{3}, 1 - (2\varrho - 1)^3\}; \quad \nu := 2$
  else
   $\mu := \mu * \nu; \quad \nu := 2 * \nu$
end

FIG. 15

CURRENT MEASUREMENT USING MAGNETIC SENSORS AND CONTOUR INTERVALS

CROSS-REFERENCE TO RELATED APPLICATIONS

This application claims the benefit of and priority from U.S. Provisional Patent Application Ser. No. 62/647,044 filed 23 Mar. 2018 entitled "CONTACTLESS CURRENT MEASUREMENT USING MAGNETIC SENSORS", incorporated herein by reference in its entirety.

TECHNICAL FIELD OF THE DISCLOSURE

The present disclosure relates generally to measuring current and, more specifically, to devices and methods that involve measuring current flowing through a conductor wire using magnetic sensors.

BACKGROUND

Measurement of currents through conductor wires performed in a contactless manner (e.g., without coming into contact with or breaking the wire) is useful for diagnostic, operational, and protection purposes in many applications, such as residential, industrial, and automotive applications. Electrical clamp meters and other current measuring apparatuses using magnetic sensors, e.g. Hall effect sensors, can be used for this purpose. However, current measurements using magnetic sensors present various challenges. One challenge is in achieving accurate measurements without precise control of the placement of the wire with respect to the current measuring apparatus. In addition, accurate measurement of a current flowing through a wire can be challenging when there are other current-carrying wires located nearby, because the current flowing through such other wires can interfere with the desired current measurement. Other challenges include simultaneous current measurement through multiple wires, ability to perform both alternating current (AC) measurements and direct current (DC) measurements, and ability to provide a current measurement apparatus that is not too bulky for use in tight spaces.

Techniques for contactless current measurement using magnetic sensors that can improve on one or more of these challenges would be desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 15 presents an example of the Levenberg-Marquardt operation that can be used with a current measurement process, according to some embodiments of the present disclosure.

DESCRIPTION OF EXAMPLE EMBODIMENTS OF THE DISCLOSURE

Overview

Figure 1:
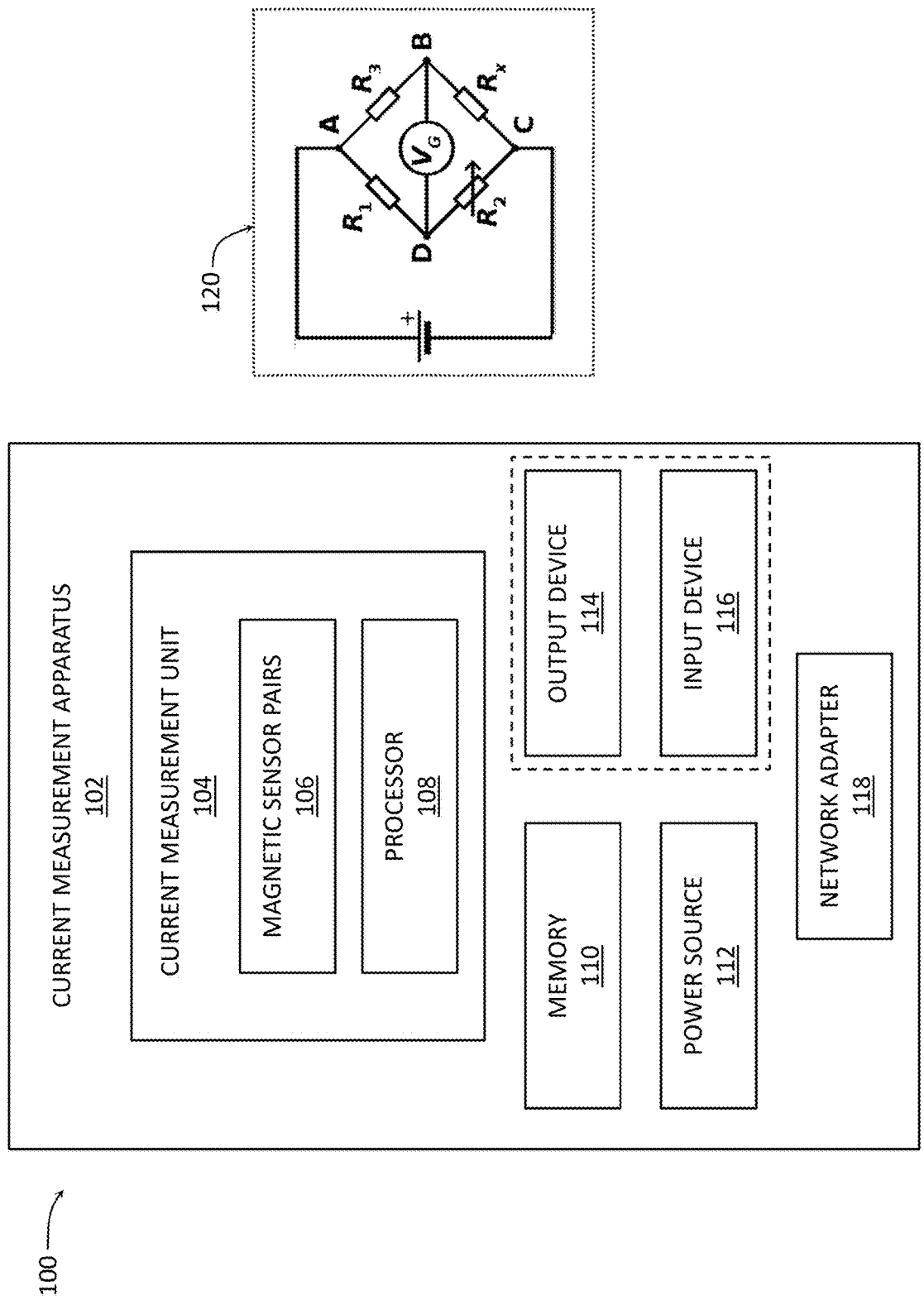
FIG. 1 provides a block diagram illustrating an example current measurement system in accordance with some embodiments of the present disclosure.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Embodiments of the present disclosure provide mechanisms for evaluating currents that might be flowing in one or more conductor wires. In particular, embodiments disclosed herein use magnetic sensors, such as e.g. AMR sensors, arranged in specific configurations within housings of current measuring apparatuses for contactlessly measuring current flow in one or more conductor wires. An example housing may include an opening for receiving the one or more conductor wires to be measured, with magnetic sensors positioned around the opening. During the measurements, the opening may be provided around, or enclosing, at least portions of the one or more conductor wires, e.g. so that the wire(s) extend through the opening. The measured outputs of the magnetic sensors can be combined using non-linear solving computations to evaluate current(s) that might be flowing through each of the one or more conductor wires. As used herein "evaluating current(s)" refers to determining or estimating, e.g. for each of the one or more conductor wires provided within the opening, one or more measures related to currents, such as one or more of current magnitude, direction of the current flow, and location (within the opening) of the current-carrying conductor wire being measured.

Embodiments disclosed herein may be particularly advantageous for evaluating currents in multi-conductor cables, such as those used in residential and industrial applications. In a multi-conductor cable, there can be three conductors: hot, neutral, and ground, and embodiments of the present disclosure allow evaluation of currents in one or more of these conductors. One of the most commonly used multi-conductor cable is referred to as a Romex® wire, which can be heat and fire resistant, easy to install, and relatively inexpensive. Romex is a common type of wire currently used in single-family residential applications, and has been used extensively for the past 40 years. However, it should be understood that the present disclosure is not specific to Romex wires and can be used to measure other types of multi-conductor cables. In general, the present disclosure is not limited to a 3-wire multi-conductor cable, and embodiments disclosed herein can be used to evaluate the current in an individual wire or in a multi-conductor cable or simply a collection of conductor wires that may include two wires, four wires, or any other number of wires.

In some embodiments, the mechanisms disclosed herein use pairs of magnetic sensors within a housing with an opening for the wires, where each magnetic sensor pair is capable of generating a pair of signals indicative of magnetic fields in two different directions (i.e. the first signal of the pair of signals may be indicative of a magnetic field in a first direction and the second signal of the pair of signals may be indicative of a magnetic field in a second direction that is different from the first direction). A hardware processor in communication with the magnetic sensor pairs may be configured to use the outputs of the sensor pairs to derive one or more measures related to current(s) that might be flowing through the one or more wires, such as e.g. magnitude of the current, direction of the current, or location of the conductor wire within the opening. Some of the embodiments are described herein for examples where the first and second directions are perpendicular to one another. However, these descriptions are applicable to embodiments where the first and second directions may have any other relationship other than being perpendicular to one another, as long as the processor has information about said relationship so that appropriate compensation may be implemented by the processor.

In some embodiments, the first directions (and, therefore, the second directions, since second directions have a certain known relationship to the first directions) of different magnetic sensor pairs are oriented in the same manner with respect to a certain common reference point. However, if this is not the case, the processor may be configured to compensate for the differences in the orientation of the different magnetic sensor pairs with respect to one another and with respect to the common reference point. The use of magnetic sensor pairs that can each measure magnetic field in two directions, e.g. in two directions that are substantially perpendicular to one another, may achieve one or more of the following advantages: enable simultaneous current measurement in multiple wires placed within the opening, reduce sensitivity of current measurements to the placement of the wire(s) within the opening (i.e. improve accuracy of current measurements while relaxing requirements for precise control of the placement of the wire(s)), reduce the impact of stray magnetic interference (e.g. magnetic fields of the Earth or magnetic fields of other current-carrying wires in the vicinity of the current measurement apparatus), expand the measurement zone, and enable both AC and DC measurements.

One aspect of the present disclosure provides an apparatus for measuring current flow through at least one conductor wire. The apparatus may include a housing having an opening for receiving the at least one wire; a plurality of magnetic sensor pairs, and a hardware processor. The plurality of magnetic sensor pairs may be arranged within the housing (i.e. arranged on or at least partially in the housing), e.g. positioned around the opening of the housing. Each magnetic sensor pair may be configured to generate signals when the at least one wire extends through the opening (e.g. when at least a portion of the wire is positioned within the opening), the signals including a first signal (e.g. a first voltage or a first current) indicative of a magnetic field in a first direction, and a second signal (e.g. a second voltage or a first current) indicative of a magnetic field in a second direction. The hardware processor may be configured to derive a measure of a current in (a current that may be flowing through) the at least one wire based on the signals generated by at least two or more of the plurality of magnetic sensor pairs.

Other aspects of the present disclosure provide methods for operating such an apparatus and methods for determining current in at least one conductor wire.

As will be appreciated by one skilled in the art, aspects of the present disclosure, in particular aspects of current measurement using magnetic sensor pairs proposed herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing magnetic sensors and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Other features and advantages of the disclosure will be apparent from the following description and the claims.

Example Current Measurement System/Device

A current carrying wire generates a magnetic field in the orthogonal plane to the direction of current flow. A measurement of the magnetic field can be used to infer the magnitude of the current flowing in the wire. For example, Hall Effect sensors can be used to measure magnetic fields using the Lorentz effect, while anisotropic magnetoresistive (AMR) sensors can measure the magnetic field based on the change in resistivity that is proportional to the perpendicular magnetic field. By using magnetic sensors, such as Hall Effect sensors and/or AMR sensors, certain challenges related to measuring current through a wire can be overcome according to various aspects of the present disclosure. For example, embodiments described herein can overcome challenges related to the magnetic field interference from nearby current carrying wires. As another example, embodiments described herein can overcome challenges related to a location of the current carrying wire not being fixed. Since magnetic field strength should drop off inversely with distance from the current carrying wire, the distance from the wire can have a significant impact on inferring the current flowing through the wire using magnetic sensors. Furthermore, using certain magnetic sensors, such as Hall Effect and/or AMR sensors, apparatus disclosed herein can generate outputs that can be used to accurately make both AC and DC measurements.

Embodiments disclosed herein present a current measuring device that may enable simultaneous current measurement in multiple wires placed within the opening. For example, embodiments disclosed herein may enable current measurements of a multi-conductor cable. In some embodiments, such a multi-conductor cable may include a hot wire that includes the current path for current flowing from the current source, a neutral wire that includes the return path for the current flow, and the bare copper wire that is a ground wire connected to an earth ground. The hot and neutral conductors typically have opposite current flow, which can result in the magnetic field generated by the two current flows being cancelled to at least a first order. Often, the current flow in the hot and neutral conductors is of the same magnitude. Some residue magnetic field strength may exist as a function of the spacing between the hot and neutral cables. As the spacing is unknown and can vary, using conventional current sensing approaches may be challenging and often not feasible. Thus, there are no existing contactless current sensing solutions for multi-conductor cables available today.

Furthermore, embodiments disclosure herein present a current measuring device that may enlarge the measurement zone while reducing stray field interference. Thus, current of a wire can be measured without precise positioning of the wire and without impact or with reduced impact from stray field interference. Advantageously, in certain embodiments, by expanding the measurement zone of the current measuring device, wires that cannot be deterministically located within a particular point or axis can be accurately measured during a current measurement process.

FIG. 1 provides a block diagram illustrating an example current measurement system 100 in accordance with some embodiments of the present disclosure. As shown in FIG. 1, the current measurement system 100 may include a current measurement apparatus 102, which may be a mobile current measurement apparatus, having a current measurement unit 104. The current measurement unit 104 may include magnetic sensor pairs 106 and a processor 108, e.g. a hardware processor. The current measurement apparatus 102 may further include a memory 110 and a power source 112. In some embodiments, the current measurement system 100 may also include one or more of an output device 114, an input device 116, and a network adapter 118.

The magnetic sensor pairs 106 may be magnetic sensor pairs configured to sense total magnetic fields in their vicinity, where at least portions of the magnetic fields may be attributed to being generated by currents flowing through one or more wires placed in the target measurement zone of the current measurement unit 104.

Magnetic sensors, such as AMR sensors, can sense the magnetic field strength in a given direction in relation to their internal magnetization. As used herein, the term "magnetic sensor pair" refers either to a pair of individual magnetic sensors (e.g. a pair of AMR sensors) that can sense the magnetic field strength in two different directions, or to a single magnetic sensor pair (e.g. a single multi-axis AMR sensor) that can sense magnetic field strength on two different directions. Embodiments of the magnetic sensor pairs 106 disclosed herein are not limited to AMR sensors and can use others types of sensors including, but not limited to, giant magnetoresistive (GMR) sensors, tunnel magnetoresistive (TMR) sensors, colossal magnetoresistive (CMR) sensors, and extraordinary magnetoresistive (EMR) sensors. In some embodiments, magnetic sensor pairs 106 may include any magnetoresistive (xMR) sensors that have a resistance that changes in response to a magnetic field. In some embodiments, magnetic sensor pairs 106 may include magneto-optical sensors or superconductor current sensors.

Each of the sensor pairs 106 may sense magnetic field in two different directions, thus generating a pair of signals indicative of the magnetic fields in different directions: the first signal of the pair of signals being indicative of a magnetic field in a first direction and the second signal of the pair of signals being indicative of a magnetic field in a second direction. For example, in some embodiments, the second direction may be perpendicular to the first direction. As described above, in order to sense magnetic field in two different directions, each of the sensor pairs 106 may either include two individual magnetic sensors (i.e. two individual magnetic sensor circuits), each performing a measurement of a magnetic field in a different direction, or be a multi-axis sensor pair (i.e. a single magnetic sensor circuit) able to measure magnetic field along multiple axes, i.e. in two (or more) different directions. In the following, the terms "sensor" and "sensor circuit" may be used interchangeably.

The sensor pairs 106 may be positioned within a housing of the current measurement unit 104, in particular around an opening within the housing, which opening may be considered to define a target measurement zone, described in greater detail below. In some embodiments illustrated in the FIGS., the plurality of sensor pairs 106 can include eight sensor pairs. However, the present disclosure is not limited as such, and, in various embodiments, more or fewer sensor pairs 106 may be included in the current measurement apparatus 102. For example, some embodiments may include 4 sensor pairs 106 or 12 sensor pairs 106, among other numbers of sensor pairs. The sensor pairs 106 may be positioned around the target measurement zone at a plurality of distances from and at a plurality of orientations with respect to a center of the target measurement zone or a certain common reference point within the target measurement zone, as described in greater detail below. Furthermore, in embodiments where magnetic sensor pairs include individual magnetic sensors, such individual sensors may be positioned within the housing separately from one another. For example, some or all magnetic sensors configured to detect magnetic field in the first direction (such sensors may be referred to as "first sensors") may be provided on one side/face of the housing, while some or all magnetic sensors configured to detect magnetic field in the second direction (such sensors may be referred to as "second sensors") may be provided on the other side/face of the housing. In another example, first and second sensors may be provided around the opening in an interleaved manner, i.e. one or more first sensors are followed by one or more second sensors, followed again by one or more first sensors, and so on, with some gap/distance separating each two sensors. For example, such interleaved sensors may be provided in a circular fashion around the opening.

In some embodiments, at least some magnetic sensors of the magnetic sensor pairs 106 may include a set of sensors configured as a Wheatstone bridge. For example, each magnetic sensor of the magnetic sensor pairs 106 may include a set of sensors, e.g. 4 sensors, configured as a Wheatstone bridge, e.g., as shown with an inset 120 in FIG. 1. Configuring these sensors in a Wheatstone bridge creates a magnetic field sensor system whose output voltage is proportional to the magnetic field strength in a given direction. In some embodiments, at least some magnetic sensors of the magnetic sensor pairs 106 may include a set of sensors configured as a half-Wheatstone bridge.

The sensor pairs 106 can output voltages that are proportional to a field strength in two different directions at the location of the sensors. These measured voltages may be provided to an analog front-end (not specifically shown in FIG. 1), which can condition first and second signals received from the sensors. In certain embodiments, conditioning the signals received from the sensors enables the signals to be provided to subsequent circuitry, such as an analog-to-digital converter (ADC) (not specifically shown in FIG. 1). In some embodiments, the conditioned signal can be provided to a multiplexed ADC, which can provide the digital signals corresponding to the field strength in each of respective directions to the processor 108 (e.g. a microcontroller).

In some embodiments, the processor 108 can execute software or an algorithm to perform the activities as discussed in this Specification, in particular activities related to current measurement using magnetic sensor pairs 106. The processor 108 may be configured to communicatively couple the current measurement unit 104 or the current measurement apparatus 102 to other system elements via one or more interconnects or buses. Such a processor may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (ASIC), or a virtual machine processor. The processor 108 may be communicatively coupled to the memory 110, for example in a direct-memory access (DMA) configuration, so that the processor 108 may read from or write to the memory 110. The memory 110 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from the sensor pairs 106, the processor 108, the memory 110, the output device 114, or the input device 116 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in FIG. 1, e.g. the sensor pairs 106 and the processor 108, can also include suitable interfaces for receiving, transmitting, and/or otherwise communicating data or information in a network environment.

In certain example implementations, mechanisms for contactless current measurement using a plurality of magnetic sensor pairs as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory 110 shown in FIG. 1, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 108 shown in FIG. 1, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory 110 may include one or more physical memory devices such as, for example, local memory and one or more bulk storage devices. The local memory may refer to random access memory or other non-persistent memory device(s) generally used during actual execution of the program code. A bulk storage device may be implemented as a hard drive or other persistent data storage device. The memory 110 may also include one or more cache memories that provide temporary storage of at least some program code in order to reduce the number of times program code must be retrieved from the bulk storage device during execution.

The power source 112 may provide power to substantially all components of the system of FIG. 1. In some implementations, the power source 112 may include one or more battery units.

Input/output (I/O) devices depicted in FIG. 1 as an input device 116 and an output device 114, optionally, can be included within or coupled to the current measurement apparatus 102. Examples of input devices may include, but are not limited to, a keyboard, a pointing device such as a mouse, or the like. The input device 116 may be configured to receive e.g. user input regarding when current measurements are to begin, what information is to be output as a result, and in which format. Examples of output devices may include, but are not limited to, a monitor or a display, speakers, or the like. In some embodiments, the output device 114 may be any type of screen display, such as plasma display, liquid crystal display (LCD), organic light emitting diode (OLED) display, electroluminescent (EL) display, or any other indicator, such as a dial, barometer, or LEDs. The output device 114 may be configured to show the result of the current measurement performed in accordance with the disclosures herein. For example, the output device 114 may be configured to provide a graphical user interface and display graphical representation of the current measured in each of the wires within the target measurement zone, as well as, optionally, relative locations of the measured wires (e.g. relative with respect to one another or relative with respect to some common reference point). In some implementations, the system may include a driver (not shown) for the output device 114. Input and/or output devices may be coupled to the current measurement apparatus 102 or to the current measurement unit 104 either directly or through intervening I/O controllers.

In an embodiment, the input and the output devices may be implemented as a combined input/output device (illustrated in FIG. 1 with a dashed line surrounding the input device 116 and the output device 114). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 118 may also, optionally, be included within or coupled to the current measurement apparatus 102 to enable it to become coupled to other systems, computer systems, remote network devices, and/or remote storage devices through intervening private or public networks. The network adapter 118 may include a data receiver for receiving data that is transmitted by said systems, devices and/or networks to the current measurement apparatus 102, and a data transmitter for transmitting data from the current measurement apparatus 102 to said systems, devices and/or networks. Modems, cable modems, and Ethernet cards are examples of different types of network adapter that may be used with the current measurement apparatus 102.

In some embodiments, some or all of the memory 110, the power source 112, the output device 114, the input device 116, and the network adapter 118 may reside in the same integrated unit as the sensor pairs 106 and the processor 108. In other embodiments, one or more of these components/devices may reside in a separate unit than the current measurement unit 104.

Example Sensor Arrangements

Figure 2:
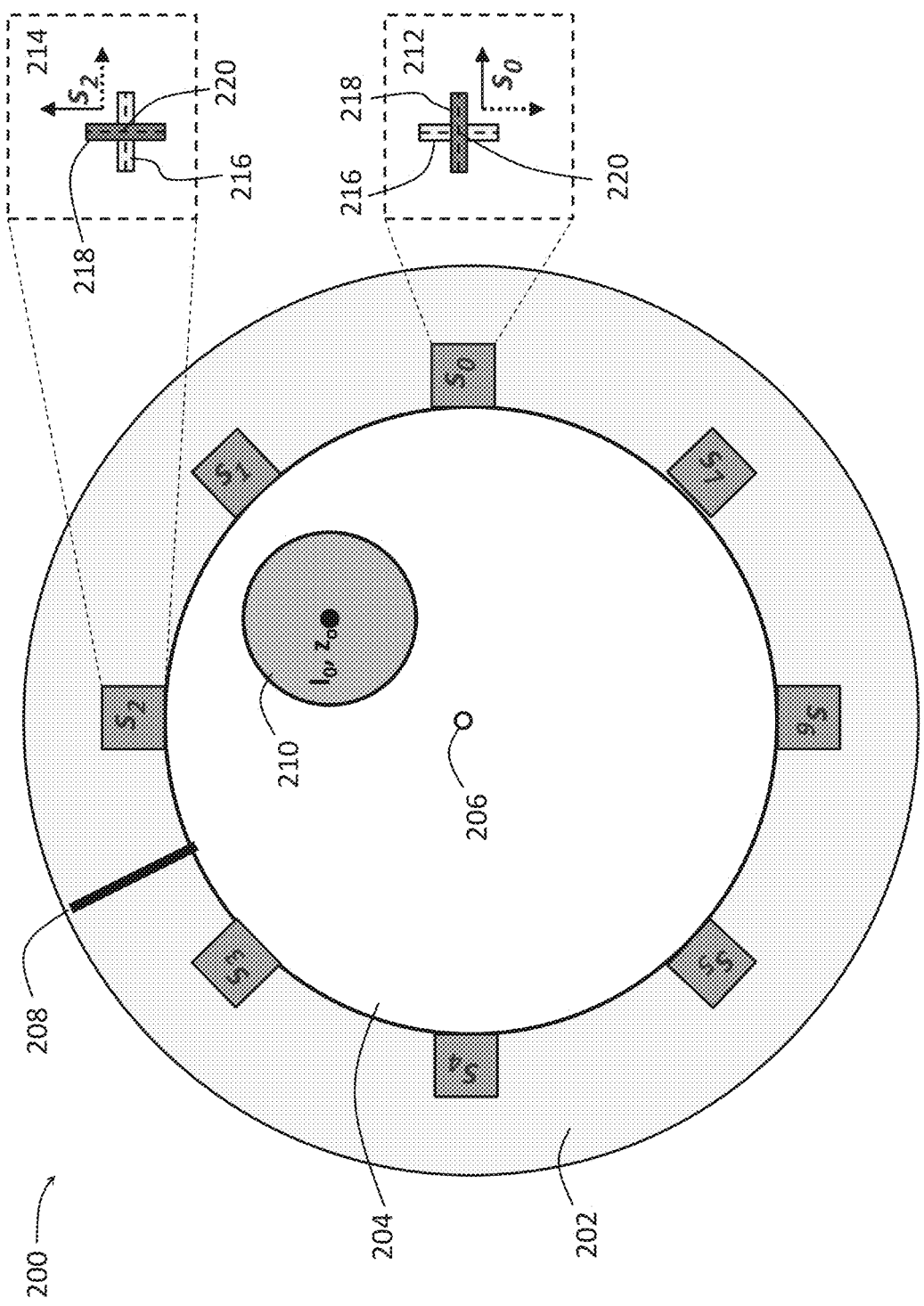
FIG. 2 provides a block diagram illustrating an example apparatus for measuring current in one or more wires in accordance with some embodiments of the present disclosure.

FIG. 2 provides a block diagram illustrating an example apparatus 200 for measuring current in one or more wires in accordance with some embodiments of the present disclosure. The current measurement apparatus 200 may be included as part of the current measurement system 100. For example, the apparatus 200 may include or be included in the current measurement unit 104 of the current measurement system 100. The apparatus 200 may include a plurality of sensor pairs, example locations (complex point locations) of which are shown in the example of FIG. 2 as eight sensor pairs $s_0$, $s_1$, $s_2$, $s_3$, $s_4$, $s_5$, $s_6$, and $s_7$, each of which representing an instance of the sensor pair 106 shown in FIG. 1. In the following, the N sensor pairs $s_0$-$s_{N-1}$ (e.g. the 8 sensor pairs $s_0$-$s_7$ shown for the examples of the FIGS.), where N is an integer equal to or greater than 1, will be referred to as sensor pairs 106, although in the FIGS. they may not be labeled with a reference numeral 106 but only shown as $s_0$, $s_1$, etc., in order to clearly differentiate between individual sensor pairs. Although eight sensor pairs are illustrated in FIG. 2 (and other FIGS.), i.e. N=8, it should be understood that the apparatus 200 (and those of other FIGS.) may include any different number (two or more) of sensor pairs 106. For example, the apparatus 200 may include 4, 6, 10, or 12 sensor pairs, among other amounts.

As shown in FIG. 2, the sensor pairs 106 may be arranged within a housing structure (or, simply, a housing) 202 that includes an opening 204 with a center 206. The opening 204 is configured for receiving one or more current carrying conductor wires on which current measurements are to be performed. While FIG. 2 illustrates the opening 204 as a substantially circular opening, in other embodiments, the opening 204 may be of any other suitable shape, such as an ellipse or a quadrilateral (e.g. a rectangle or a rhombus). Similarly, although the housing 202 is illustrated in FIG. 2 as substantially circular in shape and completely surrounding the opening 204, the present disclosure is not limited as such. For example, the housing 202 may form a fork, or a 'V' or 'U' shape. Further, the housing 202 may be capable of opening and closing to enable one or more wires to slot into or be moved into the target measurement zone defined by the opening of the housing structure. For example, a line 208 may represent the meeting of two separate arms, such as with a clamp, of the housing 202 that can be adjusted to form a gap through which one or more wires can be placed within the opening 204. In another example, the line 208 may represent an ingress point within the housing 202 for inserting one or more wires into the target measurement zone of the opening 204. The opening 204 and/or target measurement zone may be orthogonal to a length of the one or more wires being tested when the wires are positioned within the opening 204. FIG. 2 provides an example illustration of a wire 210 to be measured, provided within the target measurement zone of the opening 204.

The opening 204 may define a target measurement zone, i.e. a zone in which current measurements of current flow through the wires may be carried out. In some embodiments, the target measurement zone may be substantially the same as the opening 204, but in other embodiments that can be different. For example, a target measurement zone within the opening 204 may vary in size based on a location of the sensor pairs 206 with respect to the housing 202 and the opening 204. Further, in some embodiments, a trade-off may occur between the size of the target measurement zone and/or the amount of stray field interference on the measurement of the current flowing through a wire positioned within the target measurement zone. For example, in some embodiments, the target measurement zone may be substantially circular in shape and may have a radius of 1-5 centimeter (cm), including all values and ranges therein, e.g. a radius of 1-2 cm. In some other embodiments, the target measurement zone may have a smaller or larger radius than that of the opening 204, or may be of a different shape. For example, the target measurement zone within the opening 204 may be oval, elliptical or quadrilateral in shape. In some such cases, the housing 202 may create an oval region or region of some other shape that is capable of accepting one or more wires or at least partially surrounding the wires to be measured. In contrast to some conventional current measurement devices, one or more wires to be measured using the apparatus 200 need not be positioned in a precise X and/or Y coordinate location to accurately measure current(s) flowing through the wire(s), but may be located anywhere within the target measurement zone of the opening 204.

FIG. 2 illustrates an embodiment where the sensor pairs s 106 are placed at the perimeter of the opening 204, along the contour of the opening 204. However, in other embodiments, the sensor pairs 106 may be provided at any other locations within the housing 202 that would be suitable for measuring magnetic fields as described herein.

The apparatus 200 shown in FIG. 2 is an illustrative example and may not necessarily be drawn to scale. Thus, although each of the sensor pairs are illustrated as being roughly equidistant from the edge of the opening 204 (namely, illustrated to be at the edge of the opening 204), in other embodiments, at least some of the sensor pairs may be located a different distance from the edge of the opening 204 than at least some of the other sensor pairs. Distributing the sensor pairs 106 at approximately the same distance from one another along the contour of the opening 204 may result in more uniform measurements.

As illustrated in FIG. 2, some of the sensor pairs s 106 may be oriented differently than at least some other of the sensor pairs 106. Insets 212 and 214 shown in FIG. 2 provide schematic illustrations of two example sensor pairs 106, namely sensor pairs so and $s_2$, respectively. As illustrated for these sensor pairs, each sensor pair may be configured to sense magnetic field in a first direction, shown with a dotted arrow, and to sense magnetic field in a second direction, shown with a solid arrow. Sensing of magnetic fields in two different directions is also illustrated in the insets 212 and 214 by showing a first sensor 216 in light gray color and showing a second sensor 218 in dark gray color, representing that each sensor pair s may include a pair of individual sensors 216, 218, aligned perpendicular to one another and configured to measure magnetic fields in the first and second directions as described herein. In other embodiments, although a pair of sensors 216, 218 may be shown in this and other FIGS., each sensor pair s may include a single multi-axis sensor configured to measure magnetic fields in the first and second directions as shown in the FIGS. with dotted and solid arrows shown next to a given sensor pair. As a result of sensing magnetic fields in the first and second directions, each sensor pair s is configured to generate a first signal (e.g. a first voltage or a first current) indicative of a magnetic field in the first direction, and generate a second signal (e.g. a second voltage or a first current) indicative of a magnetic field in the second direction. A data processing system of the current measurement system 100, e.g. the processor 108 shown in FIG. 1, may then be configured to derive a measure of a current in (a current that may be flowing through) each of one or more wires placed within the opening 204 based on the first and second signals generated by at least some (e.g. at least two or more) of the plurality of sensor pairs 106.

Characteristic of the placement of the sensor pairs s 106 described herein is that, for each sensor pair 106, the first direction may be substantially perpendicular to the second direction. This is illustrated in FIG. 2 where the first direction (dotted arrow, light gray sensor 216) is substantially perpendicular to the second direction (solid arrow, dark gray sensor 218) for both sensor pairs shown with the insets 212 and 214 (and this may also hold for all other sensor pairs of the apparatus 200).

Besides the first and second direction being substantially perpendicular for all sensor pairs 106, how the different sensor pairs are oriented with respect to one another may vary according to different embodiments of the present disclosure.

In some embodiments, all of the sensor pairs 106 may be arranged with respect to a certain common reference point so that, for each sensor pair 106, the first direction is substantially perpendicular to a line connecting a sensor reference point (e.g. a magnetic center) of the magnetic sensor pair and the common reference point, and the second direction is substantially parallel to said line. This specific example is illustrated in FIG. 2 (although other descriptions provided with respect to FIG. 2 are equally applicable to the embodiments where this is not the case), where the common reference point is assumed to be the center 206 of the circular opening 204, and where the first direction (dotted arrow, light gray sensor 216) is substantially perpendicular to a line connecting a sensor reference point 220 (which may be at the crossing of the schematic illustrations of the light gray sensor 216 and the dark gray sensor 218 of each sensor pair), while the second direction (solid arrow, dark gray sensor 218) is substantially parallel that line for both sensor pairs shown with the insets 212 and 214 (and this may also hold for all other sensor pairs of the apparatus 200).

In other embodiments, at least some of the sensor pairs 106 may adopt orientation different from that described above—namely, at least some of the sensor pairs 106 may be arranged differently (rotated by a certain angle) from such an orientation with respect to the common reference point. In such embodiments, as long as the processor 108 has information regarding the orientation of the different sensor pairs, and in particular information regarding whether and by how much their first direction deviates from being perpendicular to the line connecting the sensor reference point and the common reference point or whether and by how much their second direction deviates from being parallel to that line (in some embodiments, the processor 108 may have information for the deviation of only one of the first or second directions, since the other one is perpendicular), the processor 108 can be configured to compute and apply compensation for said deviation(s) when deriving a measure of current flowing through one or more wires in the target measurement zone. Since, in some implementations, the orientation of the sensor pairs is likely to be known at the design time and be set in the final current measurement apparatus, such information may be accessible to the processor 108 by e.g. being pre-programmed in the memory 110, or by the compensation being built-in in the algorithm executed by the processor 108 in order to derive measures of currents. In other implementations, the sensor pairs 106 may be movable in that e.g. their orientation may be changed at any time. In such embodiments, the information about their orientation may be accessible to the processor 108 by e.g. being provided via the input device 116, or in any other suitable manner.

Further, in some embodiments, the sensor pairs 106 may be arranged so that a relation between the first direction (dotted arrow, light gray sensor 216) and the second direction (solid arrow, dark gray sensor 218) may be the same for all of the sensor pairs. Namely, four different examples of such relations are possible, as described below.

In a first example, a "relation" that holds for the arrangement of each of the sensor pairs 106 may be that the second direction (solid arrow, dark gray sensor 218) points away from the common reference point with respect to which the sensor pairs are arranged (the common reference point being the center 206 for the example shown in FIG. 2) and the first direction (dotted arrow, light gray sensor 216) is a result of a clockwise 90 degrees rotation of the second direction. This example is illustrated for the apparatus 200 shown in FIG. 2, as can be seen within the insets 212 and 214 (although other descriptions provided with respect to FIG. 2 are equally applicable to the embodiments where this is not the case). This example is also illustrated for the sensor arrangement 300 shown in FIG. 3 (where the first and second directions of measurements are indicated for each of the sensor pairs, providing a clear illustration of this example relation).

Figure 4:
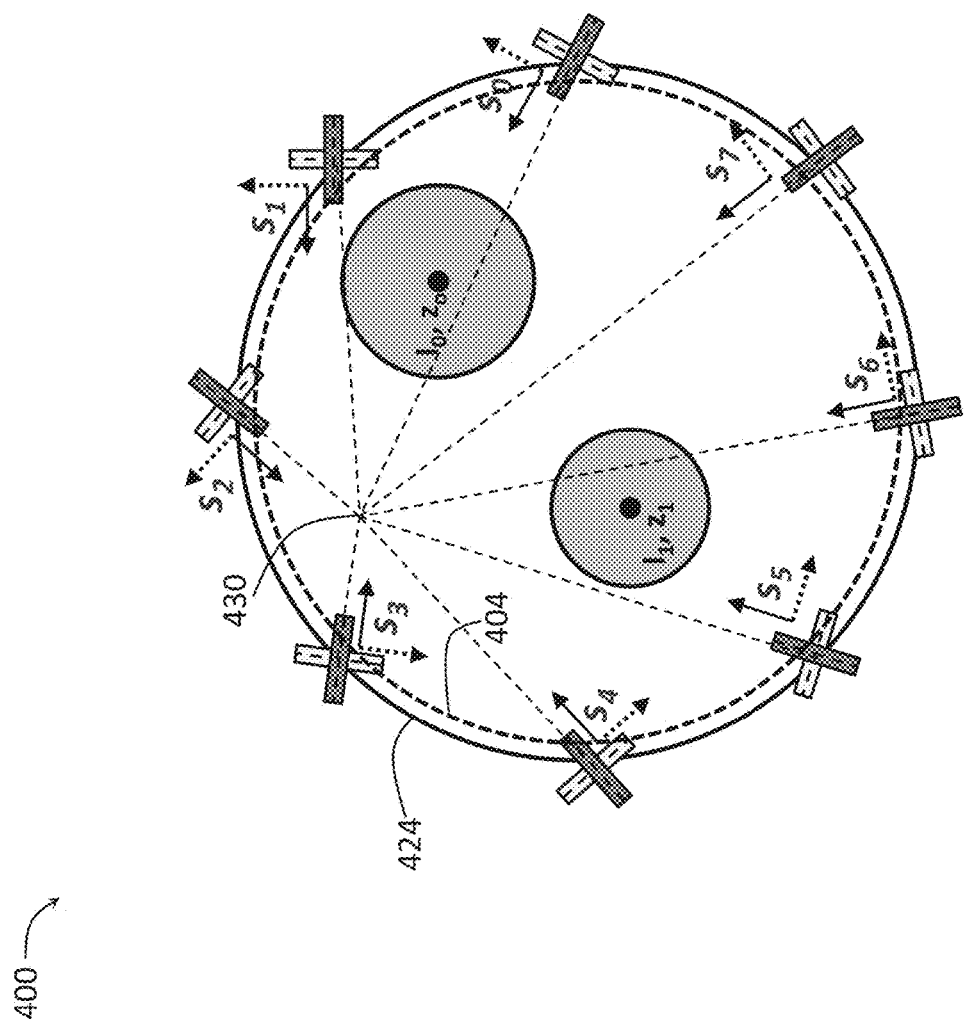

In a second example, illustrated for the sensor arrangement 400 shown in FIG. 4 (where the first and second directions of measurements are indicated for each of the sensor pairs), a "relation" that holds for the arrangement of each of the sensor pairs 106 may be that the second direction (solid arrow, dark gray sensor 218) points towards the common reference point with respect to which the sensor pairs are arranged and the first direction (dotted arrow, light gray sensor 216) is a result of a clockwise 90 degrees rotation of the second direction.

Figure 5:
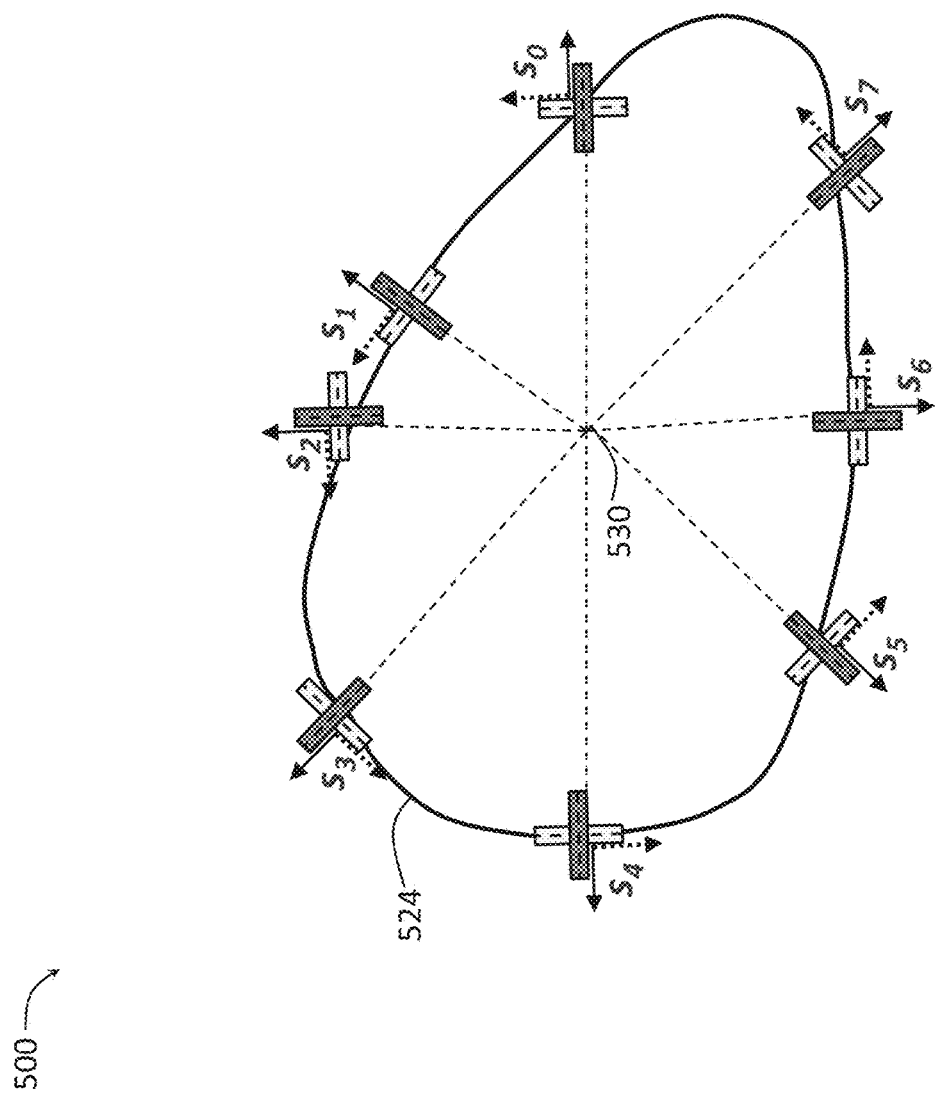

In a third example, illustrated for the sensor arrangement 500 shown in FIG. 5 (where the first and second directions of measurements are indicated for each of the sensor pairs), a "relation" that holds for the arrangement of each of the sensor pairs 106 may be that the second direction (solid arrow, dark gray sensor 218) points away from the common reference point with respect to which the sensor pairs are arranged and the first direction (dotted arrow, light gray sensor 216) is a result of a counterclockwise 90 degrees rotation of the second direction.

Finally, in a fourth example, not specifically shown in any of the FIGS., a "relation" that holds for the arrangement of each of the sensor pairs 106 may be that the second direction (solid arrow, dark gray sensor 218) points towards the common reference point with respect to which the sensor pairs are arranged and the first direction (dotted arrow, light gray sensor 216) is a result of a counterclockwise 90 degrees rotation of the second direction.

In other embodiments, at least some of the sensor pairs 106 may adopt orientation different from that described above—namely, the relation between the first direction and the second direction may be different for different sensor pairs 106. For example, the relation between the first direction and the second direction of a first sensor pair may be according to the first example of the four examples described above (i.e. the second direction points away from the common reference point with respect to which the sensor pairs are arranged and the first direction is a result of a clockwise 90 degrees rotation of the second direction), while the relation between the first direction and the second direction of a second sensor pair may be according to the second example of the four examples described above (i.e. the second direction points towards the common reference point with respect to which the sensor pairs are arranged and the first direction is a result of a clockwise 90 degrees rotation of the second direction). In general, the first and second directions of any sensor pair 106 may be in any one of the relations described above, independent of one another (i.e. some of them may have different relations, others may have the same). In such embodiments, as long as the processor 108 has information regarding the relation between the first and second directions for each of the sensor pairs whose measurements are used in the estimation of the measure of current in the one or more wires, and in particular information regarding whether one of the first or second directions is a clockwise or a counterclockwise rotation with respect to the other, the processor 108 can be configured to compute and apply compensation for said differences in the relations between the first and second directions of different sensor pairs when deriving a measure of current flowing through one or more wires in the target measurement zone. Since, in some implementations, the orientation of the first and second directions of the different sensor pairs is likely to be known at the design time and be set in the final current measurement apparatus, such information may be accessible to the processor 108 by e.g. being pre-programmed in the memory 110, or by the compensation being built-in in the algorithm executed by the processor 108 in order to derive measures of currents. In other implementations, the sensor pairs 106 may be adjustable/reconfigurable in that the relation between their first and second directions may be changed at any time. In such embodiments, the information about the relation between their first and second directions may be accessible to the processor 108 by e.g. being provided via the input device 116, or in any other suitable manner.

Still in other embodiments, the processor 108 may be configured to apply both compensations when deriving currents in the one or more wires—namely, at least some of the sensor pairs 106 may be arranged differently (rotated by a certain angle) from the same orientation with respect to the common reference point, described above, and at least some of the sensor pairs 106 (some of which may be, but do not have to be, the same as the sensor pairs 06 rotated by a certain angle from the same orientation with respect to the common reference point) may be arranged so that the relation between the first direction and the second direction may be different for different ones of these sensor pair.

The considerations with respect to the placement of the sensor pairs 106, in particular considerations regarding the orientation of different sensor pairs 106 with respect to one another and considerations regarding the relation between the first and second measurement directions of individual sensor pairs 106, will become clearer in FIGS. 3-8 illustrating different, some more general and some specific, examples of the principles described above.

Different Examples of Sensor Pair Arrangements

FIGS. 3-8 provide different examples of arrangements of sensor pairs 106 within an example apparatus for measuring current in one or more wires in accordance with various embodiments of the present disclosure. Each of FIGS. 3-8 provides a different example of placement and orientation of sensor pairs 106 and orientation of the first and second directions within the different sensor pairs 106 within a respective current measurement apparatus, shown for example sensor pairs $s_0$, $s_1$, $s_2$, $s_3$, $s_4$, $s_5$, $s_6$, and $s_7$ as illustrated in FIG. 2. Unless specified otherwise, descriptions provided above with reference to the apparatus 200 are applicable to each of FIGS. 3-8 and, in the interests of brevity, are not repeated. Therefore, only differences will be described. Furthermore, the notation described above with reference to FIG. 2 are applicable to each of FIGS. 3-8. In particular, similar to FIG. 2, for each sensor pair 106 shown in FIGS. 3-8, a dotted arrow (or/and a light gray rectangle) schematically illustrates what is described herein as the "first direction" of measurement (i.e. a direction that may be substantially perpendicular to a line connecting a sensor reference point, e.g. a magnetic center, of a given magnetic sensor pair and a common reference point that is common to all sensor pairs), while a solid arrow (or/and a dark gray rectangle) schematically illustrates what is described herein as the "second direction" of measurement (i.e. a direction that may be substantially parallel to a line connecting a sensor reference point, e.g. a magnetic center, of a given magnetic sensor pair and a common reference point that is common to all sensor pairs).

Figure 3:
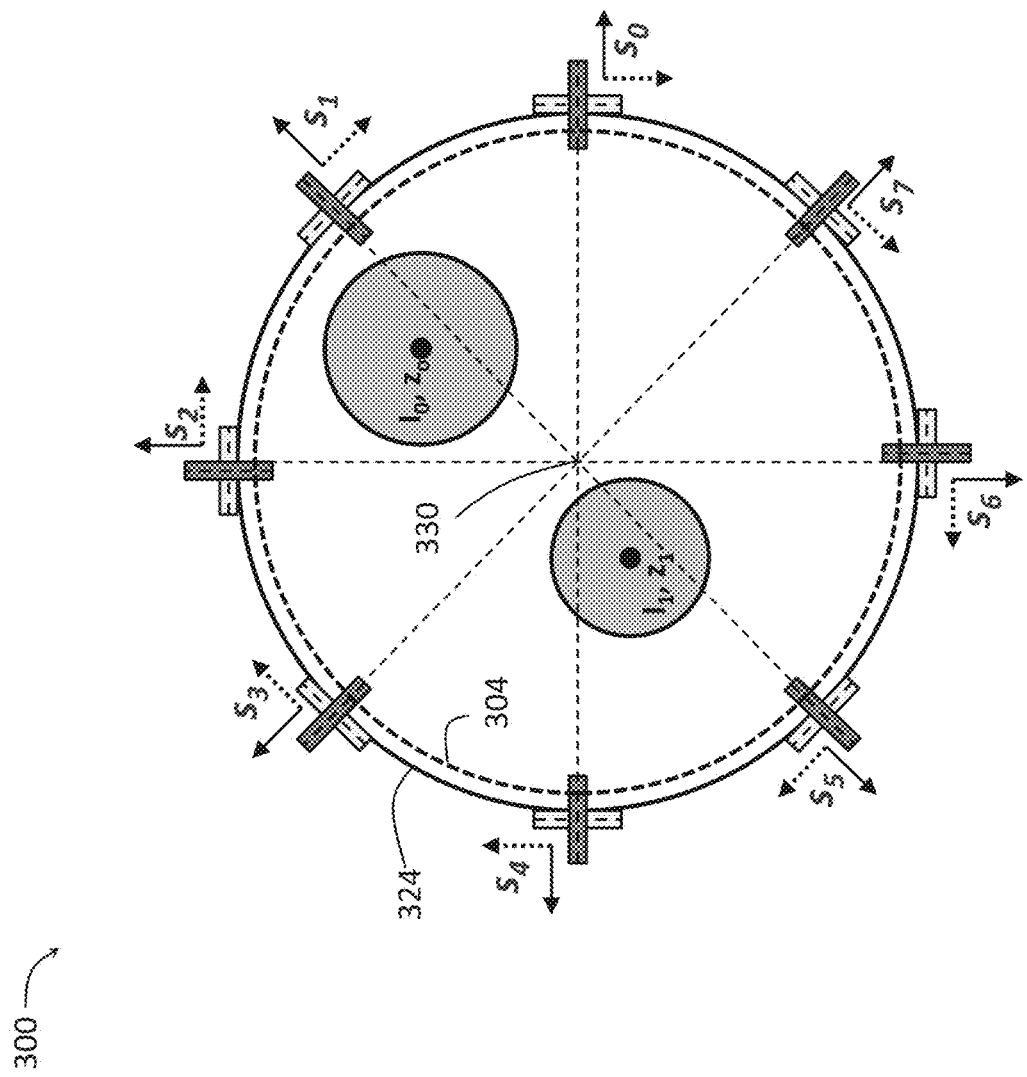
FIGS. 3-8 provide different examples of arrangements of sensor pairs within an example apparatus for measuring current in one or more wires in accordance with various embodiments of the present disclosure.

FIG. 3 provides an illustration that is substantially the same as that shown in FIG. 2 except that now also explicitly showing a contour 324 (which is a circle in this example) along which the sensor pairs 106 as described herein may be arranged with respect to a common reference point indicated in FIG. 3 as a point 330. The contour 324 is an imaginary or hypothetical closed contour along which the sensor pairs 106 are positioned, and, according to various embodiments of the present disclosure, it may but does not have to coincide with the edge of an opening for receiving the wires to be measured. Such an opening is shown in FIG. 3 as an opening 304 (shown with a dashed line), which may be similar to the opening 204, described above. FIG. 3 illustrates the opening 304 and the contour 324 being different but both being circular, but in some other embodiments, the shapes of the opening 304 and the contour 324 may be different, and, still in other embodiments, the opening 304 and the contour 324 may coincide. Together with the opening 304, the contour 324 defines the target measurement zone where magnetic measurements of current in one or more wires are to be carried out. As an example, FIG. 3 illustrates two example current carrying wires placed within the target measurement zone or within the opening 304 of the apparatus 300—a first wire shown as the one having a larger cross-section and labeled as ($I_0$, $z_0$) to indicate that it carries current $I_0$ and the wire is placed at a location $z_0$ within the opening 304, and a second wire shown as the one having a smaller cross-section labeled as ($I_1$, $z_1$) to indicate that it carries current $I_1$ and the wire is placed at a location $z_1$ within the opening 304.

FIG. 3 illustrates an embodiment where each of the sensor pairs 106 is arranged in the same manner with respect to the common reference point 330—namely, arranged so that, for each sensor pair 106, the first direction (dotted arrow, light gray sensor) along which the sensor pair 106 measures a magnetic field to generate a first signal is substantially perpendicular to a line connecting a sensor reference point (e.g. a magnetic center) of the magnetic sensor pair and the common reference point 330 (said line shown in FIG. 3 as a dashed line between each sensor pair 106 and the common reference point 330). Also for each sensor pair 106 shown in FIG. 3, the second direction (solid arrow, dark gray sensor) along which the sensor pair 106 measures a magnetic field to generate a second signal is substantially parallel to said line (which is a result of the second direction being perpendicular to the first direction). Furthermore, a relation between the first direction and the second direction is the same for all of the sensor pairs shown in the embodiment of FIG. 3. Namely, the orientation of each of the sensor pairs 106 shown in FIG. 3 is such that the second direction (solid arrow, dark gray sensor) points away from the common reference point 330 with respect to which the sensor pairs 106 are arranged along the contour 324, and the first direction (dotted arrow, light gray sensor) is a direction obtained by a clockwise 90 degrees rotation of the second direction. In other embodiments, the relation between the first and second directions of the different sensor pairs 106 may be different from the example shown in FIG. 3; in general—it may be any one of the four examples of such relations described above.

FIG. 4 illustrates an embodiment that is similar to that shown in FIG. 3 in that the sensor pairs 106 are arranged along a circular contour 404, except that now the common reference point 430 with respect to which the sensor pairs 106 are oriented is not in the center of the circular contour, which results in the sensors 106 no longer being symmetric as was the case for the embodiment of FIG. 3. Similar to FIG. 3, for the apparatus 400 shown in FIG. 4, the contour 424 is an imaginary or hypothetical closed contour along which the sensor pairs 106 are positioned, and, according to various embodiments of the present disclosure, it may but does not have to coincide with the edge of an opening for receiving the wires to be measured, such an opening shown in FIG. 4 as an opening 404 (shown with a dashed line), which may be similar to the opening 204, described above. Discussions with respect to the opening 304 and the contour 324 are applicable to the opening 404 and the contour 424 and, therefore, in the interests of brevity, are not repeated here. FIG. 4 further shows two example current carrying wires, ($I_0$, $z_0$) and ($I_1$, $z_1$), placed within the target measurement zone or within the opening 404 of the apparatus 400, illustrating an example shown in FIG. 3 and described above.

Even though the common reference point 430 is no longer in the center of an example circular contour 424, the embodiment of FIG. 4 illustrates that each of the sensor pairs 106 may still be arranged with respect to the common reference point 430 so that, for each sensor pair 106, the first direction (dotted arrow, light gray sensor) along which the sensor pair 106 measures a magnetic field to generate a first signal may be substantially perpendicular to a line connecting a sensor reference point (e.g. a magnetic center) of the magnetic sensor pair and the common reference point 430 (said line shown in FIG. 4 as a dashed line between each sensor pair 106 and the common reference point 430). Also for each sensor pair 106 shown in FIG. 4, the second direction (solid arrow, dark gray sensor) along which the sensor pair 106 separately measures a magnetic field to generate a second signal may be substantially parallel to said line (which, again, is the result of the second direction being perpendicular to the first direction). Furthermore, the embodiment shown in FIG. 4 further illustrates an example where a relation between the first direction and the second direction is the same for all of the sensor pairs shown in FIG. 4. Namely, the orientation of each of the sensor pairs 106 shown in FIG. 4 is such that the second direction (solid arrow, dark gray sensor) points towards the common reference point 430 with respect to which the sensor pairs 106 are arranged along the contour 424, and the first direction (dotted arrow, light gray sensor) is a direction obtained by a clockwise 90 degrees rotation of the second direction (i.e. the second example of the four example relations described above). In other embodiments, the relation between the first and second directions of the different sensor pairs 106 may be different from the example shown in FIG. 4; in general—it may be any one of the four examples of such relations described above.

FIG. 4 provides an illustration of a more general case than FIG. 3 in that the common reference point with respect to which the individual sensor pairs 106 are oriented is any arbitrary point within the opening for receiving wires. FIG. 5 provides an illustration of an even more general case than FIG. 4 in that, in FIG. 5, the contour 524 along which the sensor pairs 106 are positioned is not circular, but a contour of any arbitrary shape, with a common reference point 530 with respect to which the sensor pairs 106 may be arranged also being at any arbitrary point within the contour 524. In order to not clutter the drawing, FIG. 5, as well as the subsequent FIGS., does not specifically illustrate an outline of an opening within a housing of a current measurement apparatus for receiving one or more wires, but considerations provided above related to the opening and its relation to the target measurement zone and placement of the sensor pairs 106 are applicable to each of FIG. 5 and subsequent FIGS. Also in order to not clutter the drawing, FIG. 5 and subsequent FIGS. do not specifically illustrate current carrying wires.

Even though the common reference point 530 is no longer in the center of the example contour 524 and the example contour 524 is no longer a circular contour but a contour of an arbitrary shape, the embodiment of FIG. 5 illustrates that each of the sensor pairs 106 may still be arranged with respect to the common reference point 530 so that, for each sensor pair 106, the first direction (dotted arrow, light gray sensor) along which the sensor pair 106 measures a magnetic field to generate a first signal may be substantially perpendicular to a line connecting a sensor reference point (e.g. a magnetic center) of the magnetic sensor pair and the common reference point 530 (said line shown in FIG. 5 as a dashed line between each sensor pair 106 and the common reference point 530). Also for each sensor pair 106 shown in FIG. 5, the second direction (solid arrow, dark gray sensor) along which the sensor pair 106 separately measures a magnetic field to generate a second signal may be substantially parallel to said line (which, again, is the result of the second direction being perpendicular to the first direction). Furthermore, the embodiment shown in FIG. 5 further illustrates an example where a relation between the first direction and the second direction is the same for all of the sensor pairs shown in FIG. 5. Namely, the orientation of each of the sensor pairs 106 shown in FIG. 5 is such that the second direction (solid arrow, dark gray sensor) points away from the common reference point 430 with respect to which the sensor pairs 106 are arranged along the contour 424, and the first direction (dotted arrow, light gray sensor) is a direction obtained by a counterclockwise 90 degrees rotation of the second direction (i.e. the third example of the four example relations described above). In other embodiments, the relation between the first and second directions of the different sensor pairs 106 may be different from the example shown in FIG. 5; in general—it may be any one of the four examples of such relations described above.

Figure 6:
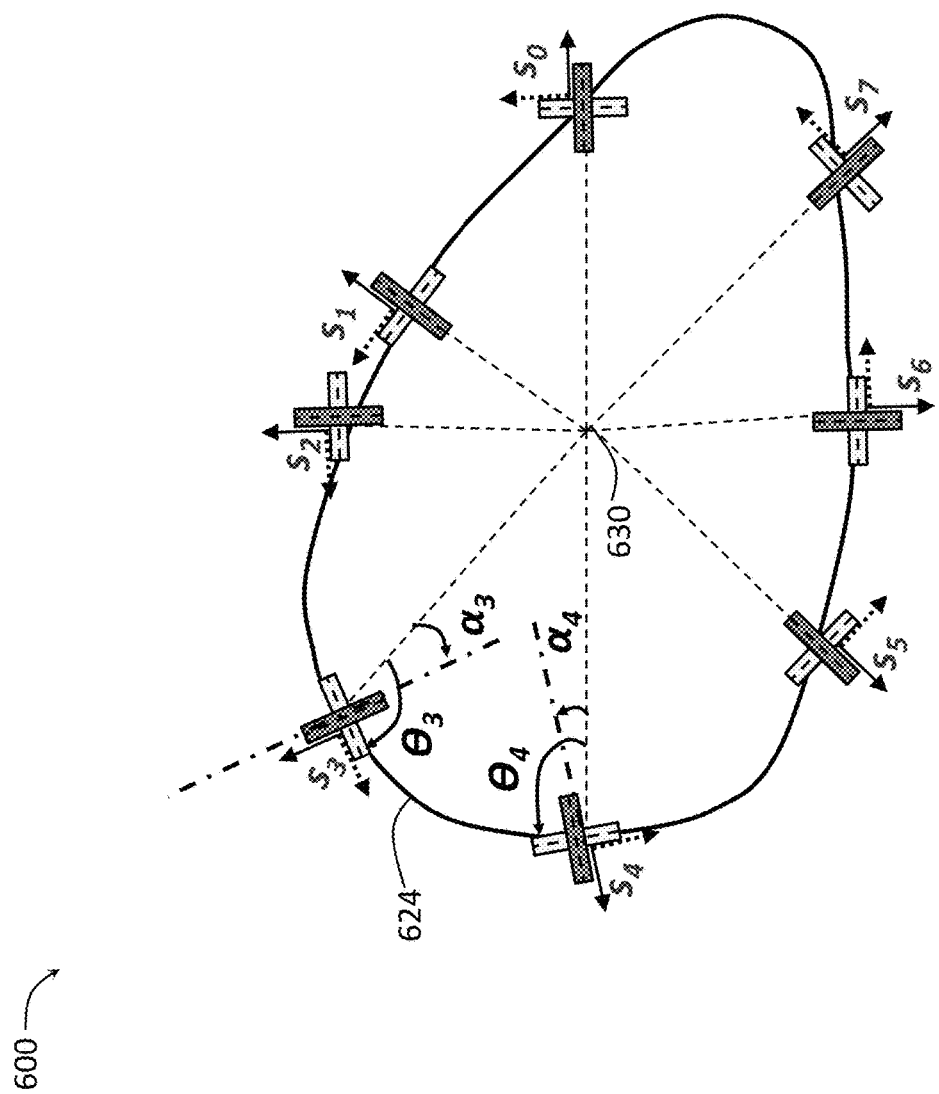

FIG. 6 provides an illustration of still a more general case than FIG. 5 in that, not only the contour 624 may be any arbitrary contour and the common reference point 630 with respect to which the individual sensor pairs 106 are oriented may be any arbitrary point within the opening for receiving wires, but the embodiment of FIG. 6 further illustrates that each of the sensor pairs 106 may be rotated by any angle with respect to their arrangement with respect to the common reference point 630. For ease of explanation, it is assumed that what has been referred to before as the "first direction" (dotted arrow, light gray sensor), namely a direction that is substantially perpendicular to a line connecting a sensor reference point (e.g. a magnetic center) of the magnetic sensor pair and the common reference point 630 (said line shown in FIG. 6 as a dashed line between each sensor pair 106 and the common reference point 630) is a "theoretical first direction." Similarly, since the second direction is perpendicular to the first direction, it is assumed that what has been referred to before as the "second direction" (solid arrow, dark gray sensor), namely a direction that is substantially parallel to a line connecting a sensor reference point (e.g. a magnetic center) of the magnetic sensor pair and the common reference point 630 (i.e. in FIG. 6 shown as the dashed line between each sensor pair 106 and the common reference point 630) is a "theoretical second direction." FIG. 6 illustrates, that in some embodiments, some sensor pairs may be arranged so that their "first direction" (dotted arrow, light gray sensor) is at a non-zero angle $\alpha_i$ (where i is an integer between 0 and N indicating an angle of a specific sensor pair $s_i$) with respect to the theoretical first direction, or, stated alternatively (since the first and second directions are perpendicular to one another), some sensor pairs may be arranged so that their "second direction" (solid arrow, dark gray sensor) is at a non-zero angle $\alpha_i$ with respect to the theoretical second direction. FIG. 6 illustrates an example where sensor pairs $s_3$ and $s_4$ are arranged at angles $\alpha_3$ and $\alpha_4$, respectively. In other embodiments, any other sensor pairs $s_i$ may be arranged at any arbitrary angle $\alpha_i$.

It should be noted that angle $\alpha_i$, described here and shown in FIG. 6 provides one example of how rotation of different sensor pairs 106 with respect to the theoretical first and second directions can be defined. As is clear from basic geometry, in various embodiments, the angle of rotation may be defined differently, e.g. as an angle that is 360°−$\alpha_i$, or 90°−$\alpha_i$. As long as the processor 108 has information indicative of the angles $\alpha_i$ (in any way that the angle of rotation is defined), for each of the sensor pairs 106, the processor 108 may compute how sensor pair measurements need to be compensated for their deviation from the theoretical first and second directions, and derive current measurements applying such compensation.

Similar to FIG. 5, the embodiment shown in FIG. 6 illustrates an example where a relation between the first direction and the second direction is the same for all of the sensor pairs shown in FIG. 6. Namely, the orientation of each of the sensor pairs 106 shown in FIG. 6 is such that the second direction (solid arrow, dark gray sensor) points away from the common reference point 630 with respect to which the sensor pairs 106 are arranged along the contour 624, and the first direction (dotted arrow, light gray sensor) is a direction obtained by a counterclockwise 90 degrees rotation of the second direction (i.e. the third example of the four example relations described above). In other embodiments, the relation between the first and second directions of the different sensor pairs 106 may be different from the example shown in FIG. 6; in general—it may be any one of the four examples of such relations described above.

Figure 7:
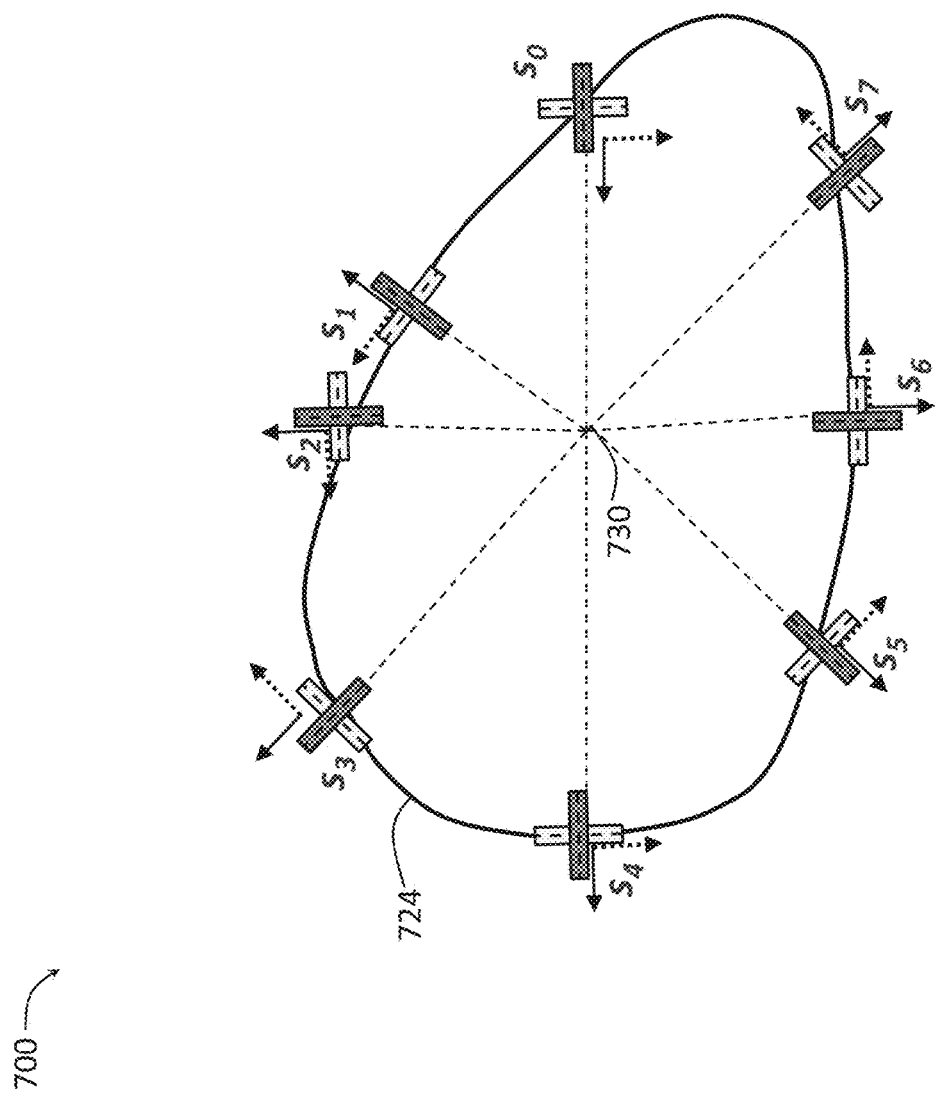

FIG. 7 provides a further illustration of still a more general case than FIG. 5 in that, not only the contour is any arbitrary contour and the common reference point with respect to which the individual sensor pairs 106 are oriented is any arbitrary point within the opening for receiving wires, but also the embodiment of FIG. 7 illustrates that a relation between the first and second directions may be different in each of the sensor pairs 106. In particular, FIG. 7 illustrates that the relation between the first direction (dotted arrow, light gray sensor) and the second direction (solid arrow, dark gray sensor) is the same for some sensor pairs, namely sensor pairs $s_1$, $s_2$, $s_4$, $s_5$, $s_6$ and $s_7$, but is different for some other sensor pairs, namely sensor pairs $s_0$ and $s_3$. The example of FIG. 7 illustrates that the orientation of each of the sensor pairs $s_1$, $s_2$, $s_4$, $s_5$, $s_6$ and $s_7$ is such that the second direction (solid arrow, dark gray sensor) points away from the common reference point 730 with respect to which the sensor pairs 106 are arranged along the contour 724, and the first direction (dotted arrow, light gray sensor) is a direction obtained by a counterclockwise 90 degrees rotation of the second direction (i.e. the third example of the four example relations described above), while the orientation of the sensor pair $s_0$ is such that the second direction (solid arrow, dark gray sensor) points towards the common reference point 730 and the first direction (dotted arrow, light gray sensor) is a direction obtained by a counterclockwise 90 degrees rotation of the second direction (i.e. the fourth example of the four example relations described above) and the orientation of the sensor pair $s_3$ is such that the second direction (solid arrow, dark gray sensor) points away from the common reference point 730 and the first direction (dotted arrow, light gray sensor) is a direction obtained by a clockwise 90 degrees rotation of the second direction (i.e. the first example of the four example relations described above).

As long as the processor 108 has information indicative of the relation between the first and second directions for each of the sensor pairs 106, the processor 108 may compute how sensor pair measurements need to be compensated for their deviation from all having the same relation, and derive current measurements applying such compensation.

Similar to FIG. 5, the embodiment of FIG. 7 illustrates that each of the sensor pairs 106 may still be arranged with respect to the common reference point 730 so that, for each sensor pair 106, the first direction (dotted arrow, light gray sensor) along which the sensor pair 106 measures a magnetic field to generate a first signal may be substantially perpendicular to a line connecting a sensor reference point (e.g. a magnetic center) of the magnetic sensor pair and the common reference point 730, while the second direction (solid arrow, dark gray sensor) along which the sensor pair 106 separately measures a magnetic field to generate a second signal may be substantially parallel to said line (which, again, is the result of the second direction being perpendicular to the first direction).

Figure 8:
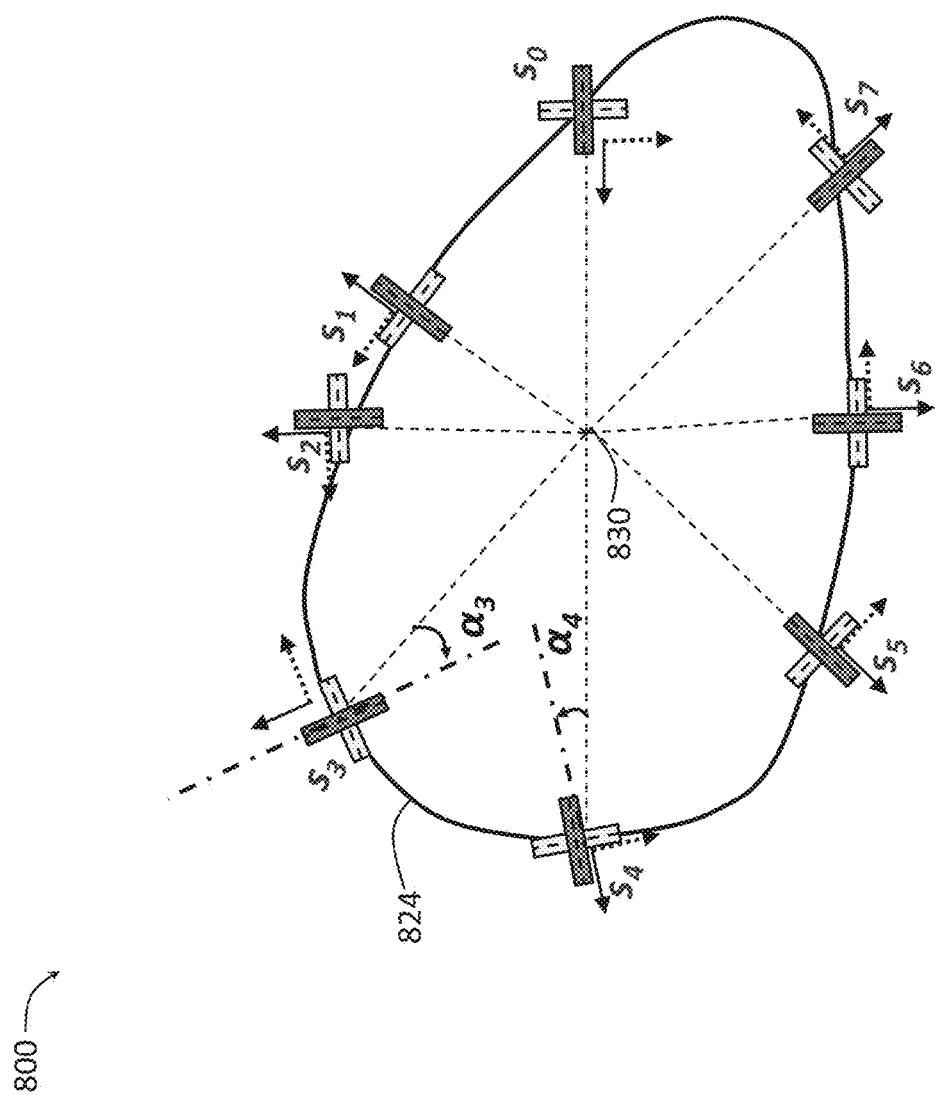

FIG. 8 provides an illustration of the most general case compared to other FIGS. Similar to FIG. 7, the embodiment of FIG. 8 illustrates that not only the contour 824 is any arbitrary contour and the common reference point 830 with respect to which the individual sensor pairs 106 are oriented is any arbitrary point within the opening for receiving wires, but also the embodiment of FIG. 8 illustrates that a relation between the first and second directions may be different in each of the sensor pairs 106. To show that, the embodiment of FIG. 8 illustrates the relations between first and second directions as shown in the example of FIG. 7—namely each of the sensor pairs $s_1$, $s_2$, $s_4$, $s_5$, $s_6$ and $s_7$ having their first and second directions according to the third relation described above, the sensor pair $s_0$ having its first and second directions according to the fourth relation described above, and the sensor pair $s_3$ having its first and second directions according to the first relation described above. Moreover, similar to FIG. 6, the embodiment of FIG. 8 further illustrates that each of the sensor pairs 106 may be rotated by any angle with respect to their arrangement with respect to the common reference point 830. To show that, the embodiment of FIG. 8 illustrates different rotations of different sensor pairs as shown in the example of FIG. 6—namely an example where sensor pairs $s_3$ and $s_4$ are arranged at angles $\alpha_3$ and $\alpha_4$, respectively. Thus, FIG. 8 may be seen as a combination of FIGS. 6 and 7. Therefore, discussions provided with respect to each of FIGS. 6 and 7 are applicable to FIG. 8 and are not repeated here in the interests of brevity.

As long as the processor 108 has information indicative of the angles $\alpha_i$ (in any way that the angle of rotation is defined) and information indicative of the relation between the first and second directions for each of the sensor pairs 106, for each of the sensor pairs 106, the processor 108 may compute how sensor pair measurements need to be compensated for their deviation from the theoretical first and second directions and for their deviation from all having the same relation, and derive current measurements applying such compensation.

While not specifically shown in FIGS. 2-8, in still further embodiments of these FIGS., the first and second directions in which each sensor pair 106 may measure magnetic fields do not necessarily have to be perpendicular to one another. In such embodiments, as long as the processor 108 has information indicative of the angles between first and second directions for each sensor pair 106, the processor 108 may compute how sensor pair measurements need to be compensated for their deviation from the first and second directions being perpendicular to one another, and derive current measurements applying such compensation.

Furthermore, although descriptions of various locations and orientations of the sensor pairs 106 are provided with respect to FIGS. 2-8 that show each sensor pair 106 as implemented as a single unit, these descriptions are equally applicable to individual magnetic sensors of each sensor pair 106 being implemented separately and at a distance from one another—such as e.g. on different sides of the housing, or in an interleaved manner as mentioned above.

Example Current Measurement Methods and Processes

Figure 9:
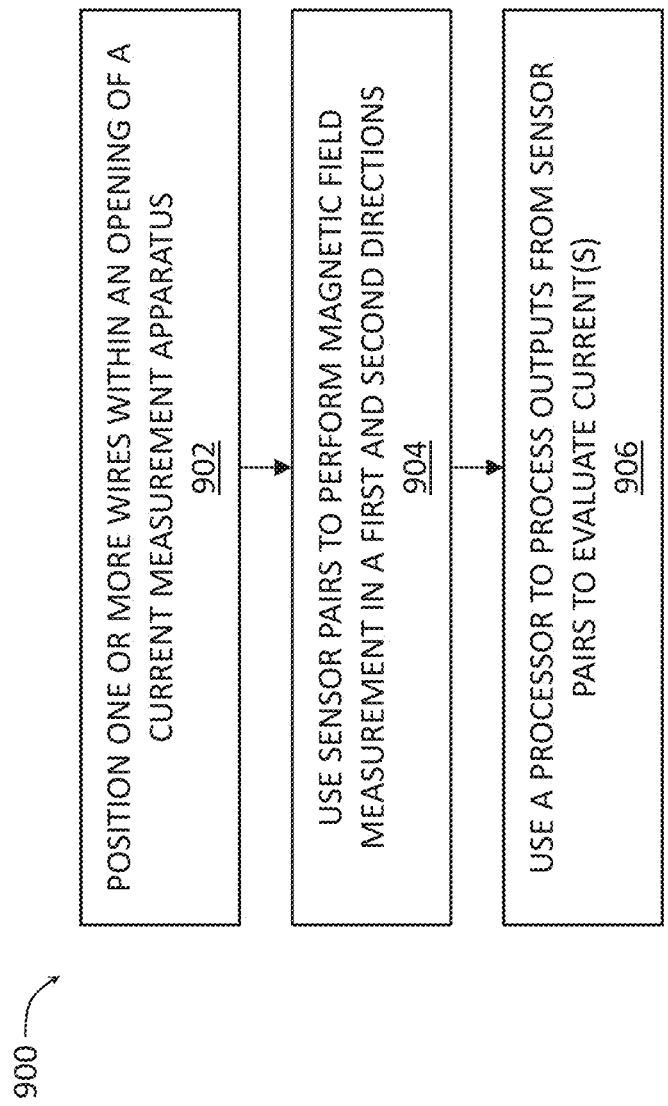
FIG. 9 presents a flowchart of an example method of operating an apparatus for measuring current flow through at least one conductor wire according to some embodiments of the present disclosure.

FIG. 9 presents a flowchart of an example method 900 of operating an apparatus for measuring current flow through at least one conductor wire according to some embodiments of the present disclosure. The method 900 can be implemented using any current measurement system that can measure the amount of current flowing through one or more wires. The method 900, in whole or in part, can be implemented using, for example, the mobile current measurement apparatus 102, the current measurement unit 104, one or more processors 108, the sensor pairs 106, and the like.

The method 900 may begin with a block 902 where a wire (or multiple wires) is positioned/enclosed within an opening of the current measuring apparatus 102, placed within a target measurement zone of the current measuring apparatus 102, thus initiating measurement of a current in a wire. In some embodiments, the current measuring apparatus 102 may be permanent or affixed to a component enabling continuous or intermittent monitoring of current in a wire or a device in which embodiments the block 902 may not have to be repeated for every current measurement. In some such embodiments, the process 900 may be performed intermittently or continuously. Block 902 may include enclosing the wire within an opening in a housing of the current measurement apparatus 102 so that the wire extends through the opening (i.e. at least a portion of the wire is positioned within the opening). The wire may be placed substantially perpendicular to the plane of the opening.

At block 904, a plurality of magnetic sensor pairs 106 of the current measurement apparatus 102 may be used, while the wire is enclosed within the opening, to generate signals indicative of magnetic fields in different directions. In particular, the sensor pairs 106, which may be placed and oriented in the current measurement apparatus 102 according to any of the embodiments described above, may be used to each generate two signals: a first signal (e.g. a first voltage or a first current) indicative of a magnetic field in a first direction, and a second signal (e.g. a second voltage or a first current) indicative of a magnetic field in a second direction.

At block 906, a processor of the current measurement apparatus may be used to receive and process the signals generated by the plurality of magnetic sensor pairs while the wire was enclosed within the opening. In particular, the processor 108 may receive the first and second signals generated by at least two or more of all of the sensor pairs 106, and derive a measure of a current in the wire based on these signals. In various embodiments, the first and second signals of one or more sensor pairs 106 may be subject to further processing, e.g. to filter noise, etc., prior to deriving the measure of the current. In block 906, the processor 108 may be configured to compute and apply compensation as described above, e.g. to compensate for some sensor pairs deviating from the theoretical first and second directions and/or to compensate for some sensor pairs not all having the same relation between their first and second directions.

Figure 10:
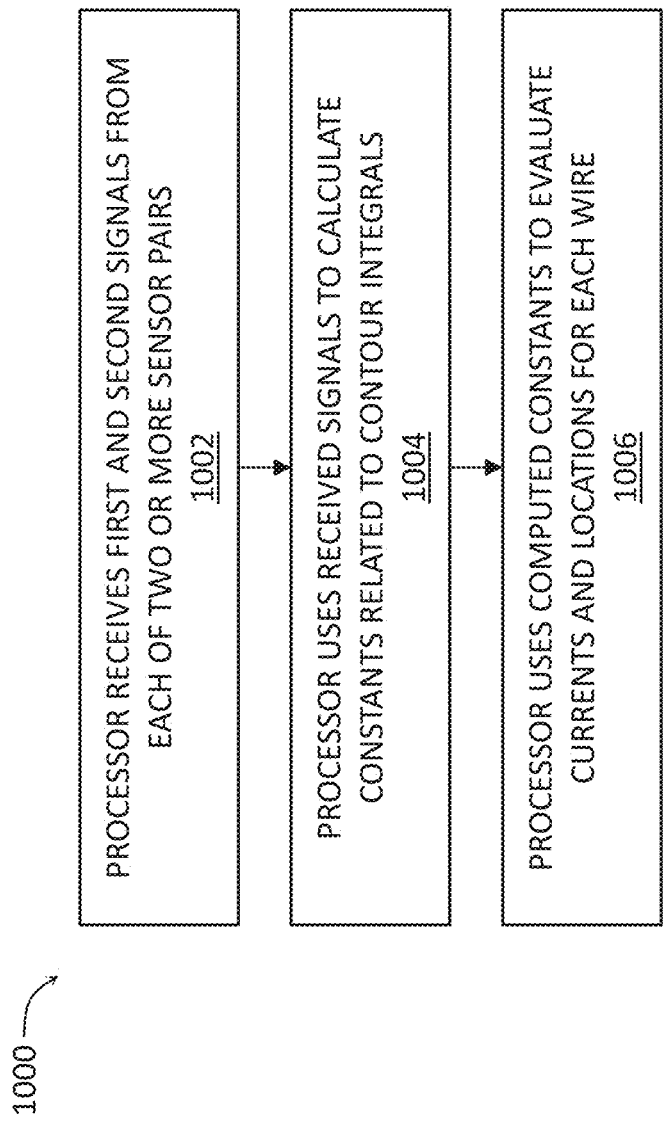
FIG. 10 presents a flowchart of an example process of determining current flow through at least one conductor wire according to some embodiments of the present disclosure.

FIG. 10 presents a flowchart of an example process 1000 of determining current flow through at least one conductor wire according to some embodiments of the present disclosure. The process 1000 can be implemented by any current measurement system that can measure the amount of current flowing through one or more wires. The process 1000, in whole or in part, can be implemented using, for example, the mobile current measurement apparatus 102, the current measurement unit 104, one or more processors 108, the sensor pairs 106, and the like. The process 1000 may be performed in response to a wire being positioned within an opening of the current measuring apparatus 102, positioned within a target measurement zone of the current measuring apparatus 102, a command from a user, or any other trigger that may initiate measurement of a current in a wire. In some embodiments, the current measuring apparatus 102 may be permanent or affixed to a component enabling continuous or intermittent monitoring of current in a wire or a device. In some such embodiments, the process 1000 may be performed intermittently or continuously. Although a number of different systems can perform some or all of the process 1000, to simplify discussion, the process 1000 will be described with respect to particular systems.

The process 1000 begins at block 1002 where a processor, e.g. the processor 108, receives first and second signals from each of at least two magnetic sensor pairs 106 as described herein. The first and second signals may measure magnetic field in two different directions, i.e. the first and the second directions perpendicular to one another, which may be created by the at least one wire positioned in the opening of the current measurement apparatus 102. For example, a wire may be a motor control wire, a wire on or connected to a printed circuit board (PCB), or any other type of current carrying wire. The magnetic field may be formed as a result of current flowing in the wire in accordance with Oersted's law. Different sensor pairs may generate different first and second signals corresponding to a different measurement of the magnetic field based at least in part on the distance of the wire from the different sensor pairs. Further, stray magnetic field interference may, in some cases, result in different measurements being obtained by the two sensor pairs. For a given sensor pair, the measurements of the first and second signals may differ because of the different directions of the measurements.

At block 1004, the processor 108 may use the sensor measurements to calculate constants A related to integrals around the contour (e.g. the contour 824 or other contours shown in FIGS.) along which the sensor pairs 106 are arranged. In particular, the processor 108 may compute a plurality of contour integrals from which the constants A can be derived.

For an example where two current wires are within the opening (as shown in some FIGS.), four equations may be used to determine constants A at block 1004, which constants are later used to find two currents within the opening. For example, this may be done as follows:

$$A0 = \frac{1}{2\pi i} \oint \frac{M(z)R(z)}{z} dz$$

$$A1 = \frac{1}{2\pi i} \oint M(z)R(z) dz$$

$$A2 = \frac{1}{2\pi i} \oint z M(z)R(z) dz$$

$$A3 = \frac{1}{2\pi i} \oint z^2 M(z)R(z) dz$$

If three wires were placed within the opening, then additional equations would be needed for the computations of block 1004, in which case two more constants A would be computed by the processor 108 (together with the 4 constants above, this would result in a total of 6 equations):

$$A4 = \frac{1}{2\pi i} \oint z^3 M(z)R(z) dz$$

$$A5 = \frac{1}{2\pi i} \oint z^4 M(z)R(z) dz$$

This can be extended further to embodiments where even more wires are placed within the opening of the current measurement apparatus 102, all of which embodiments are within the scope of the present disclosure.

In each of these equations, as a process of computing the constants A, the processor 108 computes the integrals around the contour along which the sensor pairs are arranged. These integrals are approximated as finite discrete sums using discrete measured values M(z), received from the sensors and indicative of magnetic field in different directions. In some embodiments, the processor 108 may also use intermediate sensors values obtained by some form of interpolation. To compute a contour integral, the processor 108 needs to determine the values of the integrated function around the contour of integration. The processor 108 has information regarding z's (where z is the integration variable on the contour), since they are the actual points of the contour. The processor 108 further has information regarding R(z) because it is the distance from each point z of the contour to the common reference point (in various embodiments, R(z) values can be computed and pre-stored in a table stored in the memory 110 and accessible to the processor 108, or the processor 108 may be configured to compute those as a part of the algorithm, e.g. compute those on-the-fly). The processor 108 has information regarding the magnetic field M(z) because it is measured by the plurality of magnetic sensor pairs 106 located on the contour. To be more precise, the processor 108 does not necessarily have information regarding M(z) at all the points of the contour, but just at the finitely many (i.e. discrete) points where the sensor pairs are located. The processor 108 may then use these specific points to approximate continuous integrals with discrete sums. In some embodiments, the processor 108 may be configured to create/generate more discrete M(z) values by interpolating between the existing ones (i.e. by interpolating between the ones for which sensor pairs 106 obtained measurements).

The integrals are taken around the path of the clamp (i.e. the path that contains all the sensor pairs). Each value M(z) may be represented as $M(z)=V_1(z)+iV_1'(z)$, where $V_1$ is the measurement along the first direction (i.e. dotted arrow, light gray; e.g. the sensor 216 shown in FIG. 2) by a given sensor pair at a location z, and $V_1'$ is the measurement along the second direction (i.e. solid arrow, dark gray; e.g. the sensor 218 shown in FIG. 2) given by the sensor pair at the location z. R(z) is the distance from the location z where a given sensor pair is placed to the common reference point (e.g. point 330 shown in FIG. 3).

Once the processor 108 calculated the A's (i.e. constants A are now known), in block 1006, the processor 108 can solve a system of equations with two unknowns per each wire inside the clamp opening, where the two unknowns are a current value I and current location z. For example, for the example with two wires shown in FIGS. 3 and 4, the two unknowns for the first wire are $I_0$, $z_0$, and the two unknowns for the second wire are $I_1$, $z_1$. Thus K wires inside the opening would have 2K unknowns and need 2K equations, where K is an integer equal to or greater than 1. Continuing with the example described of K=2, implying two wires inside the opening, the four equations that the processor 108 would solve at block 1008 to determine the four unknowns $I_0$, $z_0$, $I_1$, $z_1$, could be as follows:

$$I_0 + I_1 = A_0$$

$$z_0 I_0 + z_1 I_1 = A_1$$

$$z_0^2 I_0 + z_1^2 I_1 = A_2$$

$$z_0^3 I_0 + z_1^3 I_1 = A_3$$

Extending to three wires inside the opening (i.e. K=3), the equations that the processor 108 would solve at block 1006 would become:

$$I_0 + I_1 + I_2 = A_0$$

$$z_0 I_0 + z_1 I_1 + z_2 I_2 = A_1$$

$$z_0^2 I_0 + z_1^2 I_1 + z_2^2 I_2 = A_2$$

$$z_0^3 I_0 + z_1^3 I_1 + z_2^3 I_2 = A_3$$

$$z_0^4 I_0 + z_1^4 I_1 + z_2^4 I_2 = A_4$$

$$z_0^5 I_0 + z_1^5 I_1 + z_2^5 I_2 = A_5$$

Thus, the case of 3 wires provides 6 equations and 6 unknowns (namely, unknowns $I_0$, $z_0$, $I_1$, $z_1$, $I_2$, $z_2$).

This can be extended further to embodiments where even more wires are placed within the opening of the current measurement apparatus 102, all of which embodiments are within the scope of the present disclosure. Namely, analogous equations could be written for the general case of any number of K wires and, for the general case of K wires, solution of the equations (as implemented in the processor 108) may be given by the following:

Let $$\begin{pmatrix} p_1 \\ p_2 \\ \ldots \\ p_K \end{pmatrix} = \begin{pmatrix} A_{K-1} & \ldots & A_1 & A_0 \\ A_K & \ldots & A_2 & A_1 \\ \ldots & \ldots & \ldots & \ldots \\ A_{2K-2} & \ldots & A_2 & A_{K-1} \end{pmatrix}^{-1} \begin{pmatrix} A_K \\ A_{K+1} \\ \ldots \\ A_{2K-1} \end{pmatrix},$$

where, as before $$A_n = \frac{R}{2\pi i} \oint z^{n-1} M(z) dz.$$

Then $z_0$, $z_1$, ..., $z_{K-1}$ may be the roots of polynomial $p(z) = z^K - p_1 z^{K-1} - p_2 z^{K-2} - \ldots - p_K$.

In this manner, measurements along first and second directions as described herein may be used to compute measures of currents (i.e. $I_0$, and so on) and locations of the wires (i.e. $z_0$, and so on) within the opening of the current measurement apparatus 102.

Although not specifically shown in FIG. 10, in some embodiments, the method 1000 may further include the processor 108 computing and applying appropriate compensation to account for possible variations in orientation of the sensor pairs and differences in their relation between first and second directions of measurement, as described herein.

Example Mathematical Derivations

Some mathematical derivations which may help explain the background for the algorithm implemented by the processor 108 to determine currents and locations for each of the wires within the opening of the current measurement apparatus 102 will now be explained.

Figure 11:
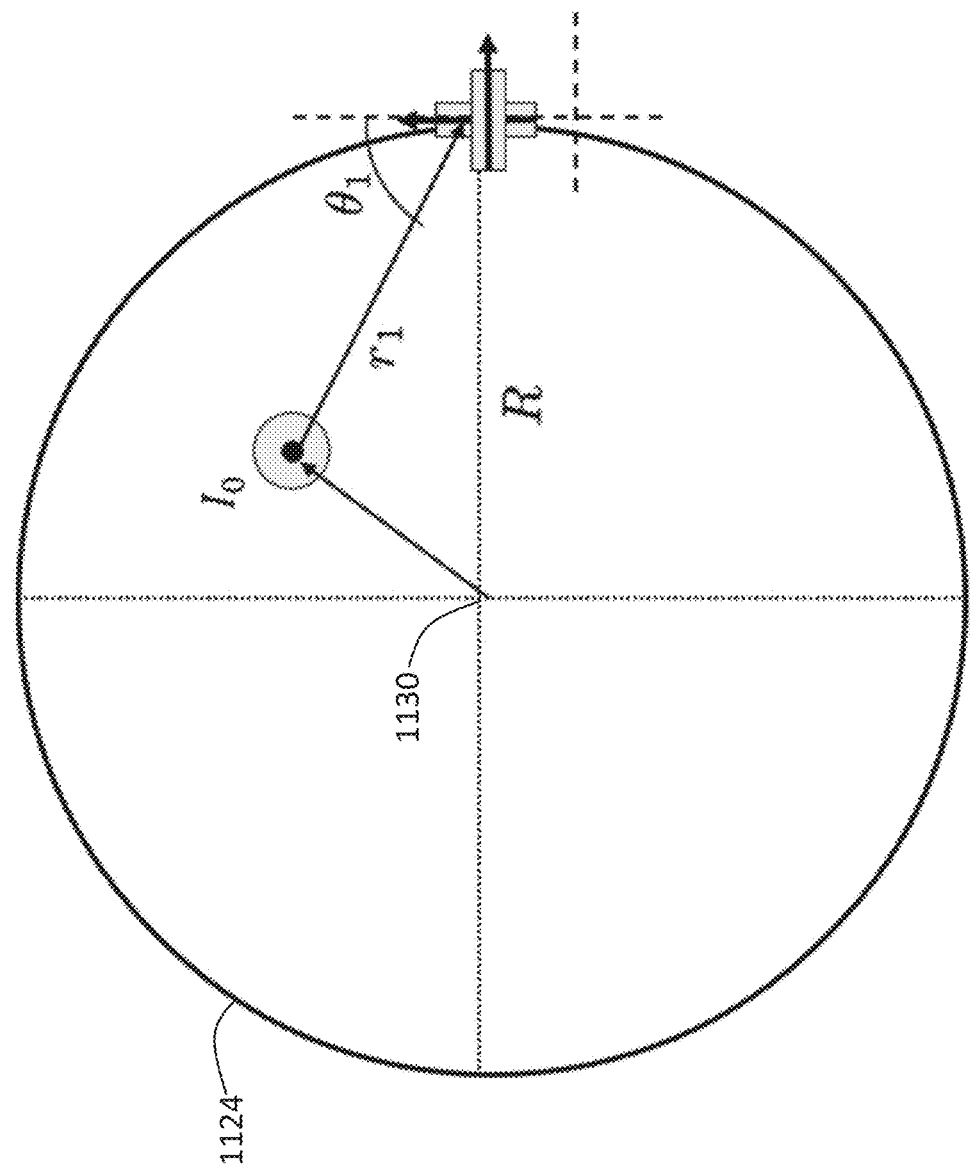
FIGS. 11-13 illustrate an example contour along which one or more sensor pairs may be placed, an example wire inside the contour, and an example sensor pair, according to some embodiments of the present disclosure.

FIG. 11 illustrates a contour 1124, which is an example of the contours described above, inside which a wire $I_0$, $z_0$ is placed (i.e. the unknowns for the processor 108 to figure out are a current in the wire, or any suitable measure of such current, $I_0$ and location of the wire $z_0$), as well as an example sensor pair. Descriptions provided above with respect to the contour, it's relationship to the opening of the current measurement apparatus 102, considerations with respect to the sensor pairs, etc., are applicable to the special case example illustrated in FIG. 11 (as well as FIGS. 12 and 13) and, therefore, in the interests of brevity, are not repeated here.

The two measurements (i.e. a measurement along the first direction and a measurement along the second direction as described herein) of a single sensor pair located at a distance r1 from the wire, for the example of a single wire with current $I_0$ are given by $$V_1 = \frac{I_0 \sin(\theta_1)}{r_1}, \quad V_1' = \frac{I_0 \cos(\theta_1)}{r_1}$$

It may be noted that the equations above may be missing a scaling constant—a magnetic constant combined with sensor scaling to the magnetic measurement units. This constant is known and the processor 108 may be configured to use this constant as a final scaler to convert the result to whatever current measurement units are being used (A, mA, etc).

Figure 12:
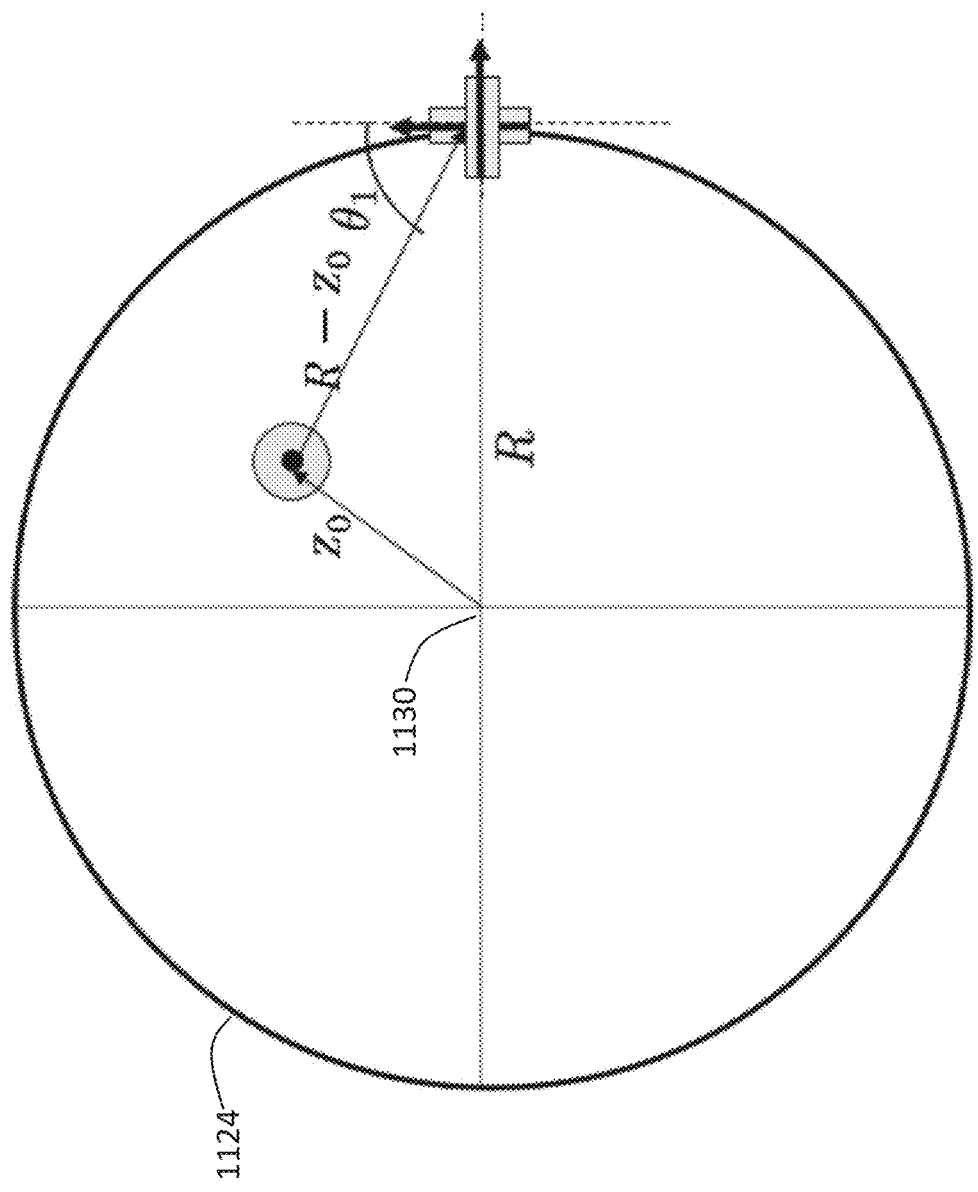

FIG. 12 provides an illustration of FIG. 11 but in a complex plane.

From basic geometry, $$R - z_0 = |R - z_0| e^{-i(\frac{\pi}{2} - \theta_1)} = r_1 e^{-i(\frac{\pi}{2} - \theta_1)} =$$

$$\frac{1}{\frac{1}{r_1} e^{i(\frac{\pi}{2} - \theta_1)}} = \frac{1}{\frac{1}{r_1}(\sin(\theta_1) + i\cos(\theta_1))} = \frac{1}{\frac{V_1}{I_0} + i\frac{V_1'}{I_0}} = \frac{I_0}{V_1 + iV_1'},$$

so $$V_1 + iV_1' = \frac{I_0}{R - z_0} \qquad (1)$$

Now consider a general case of the pair of sensors located at a generic point z on our circle of radius R, and let $z_0$ be the location of the current $I_0$. Let $M(z, z_0, I_0) = V(z, z_0, I_0)_1 + iV_1'(z, z_0, I_0)$ be the magnetic contribution of $I_0$.

Figure 13:
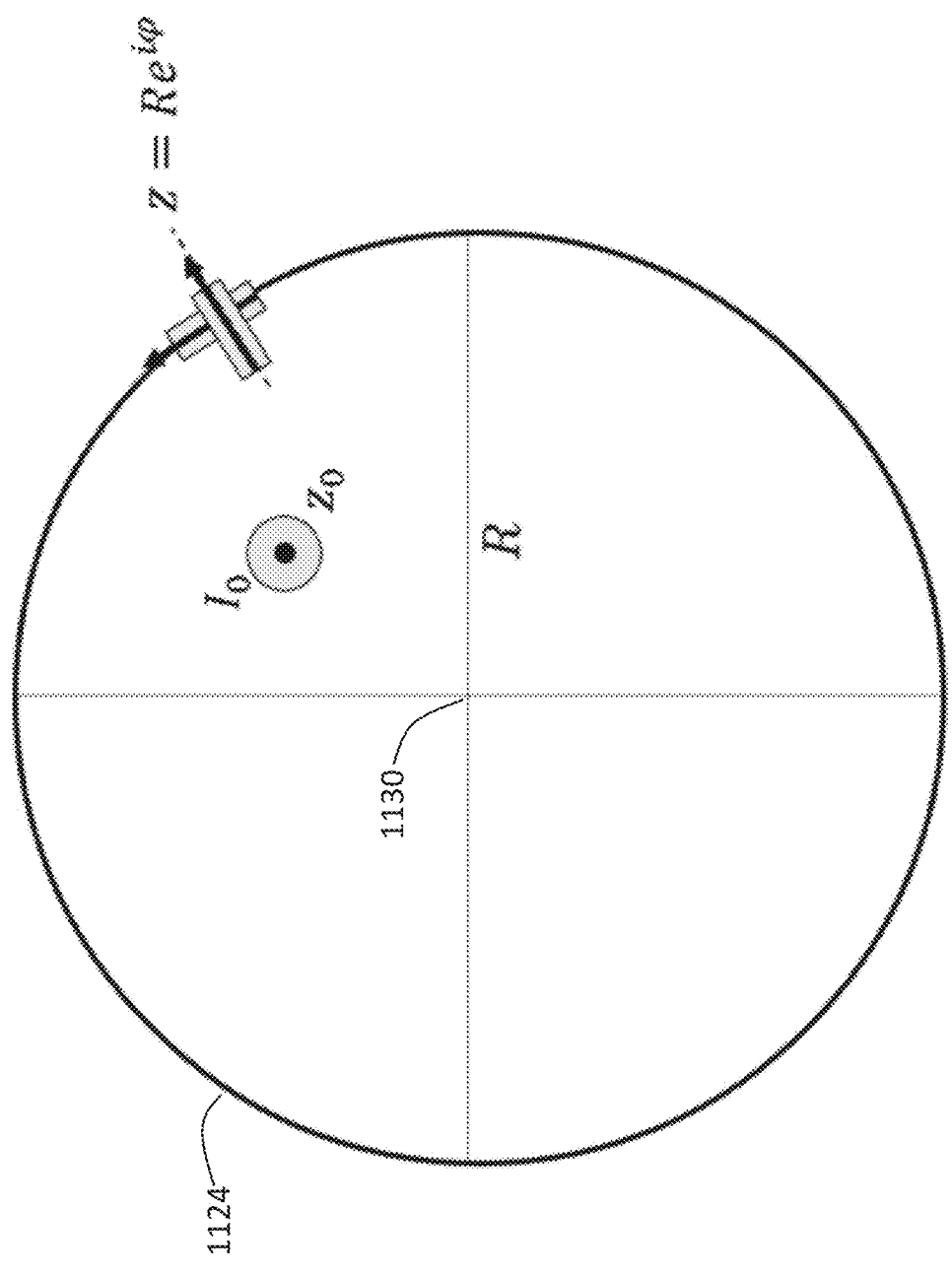

Rotating FIG. 12 by $-\varphi$ to put z at R is equivalent to multiplication by $$\frac{\bar{z}}{R'}$$

as is illustrated in FIG. 13. This rotation preserves the relative position of the current to the magnetic sensors, thus measurements are not altered. Thus, using formula (1), $$M(z, z_0, I_0) = M\left(R, \frac{\bar{z} z_0}{R}, I_0\right) = \frac{I_0}{R - \frac{\bar{z} z_0}{R}} = \frac{I_0 z}{Rz - Rz_0} = \frac{I_0}{R} \frac{z}{z - z_0} \qquad (2)$$

Now, suppose that we have one magnetic source inside the contour 1124 and other magnetic sources, outside of the contour 1124, each contributing equation (2) to the total measurement:

$$M(z) = V(z)_1 + iV_1'(z) = \frac{I_0}{R}\frac{z}{z-z_0} + \frac{I_1}{R}\frac{z}{z-z_1} + \frac{I_2}{R}\frac{z}{z-z_2} + \frac{I_3}{R}\frac{z}{z-z_3} + \ldots,$$

where $z_0$ is inside the contour 1124 and other currents are outside the contour.

Then, by the Cauchy's residue theorem, $$\frac{R}{2\pi i}\oint \frac{M(z)}{z}dz = I_0, \quad (3)$$

with integral taken around the circle.

Moreover, if the first two current locations $z_0$ and $z_1$ are inside the circle, then $$\frac{R}{2\pi i}\oint \frac{M(z)}{z}dz = I_0 + I_1 \quad (4)$$

$$\frac{R}{2\pi i}\oint M(z)dz = z_0 I_0 + z_1 I_1$$

$$\frac{R}{2\pi i}\oint zM(z)dz = z_0^2 I_0 + z_1^2 I_1$$

$$\frac{R}{2\pi i}\oint z^2 M(z)dz = z_0^3 I_0 + z_1^3 I_1$$

Thus, we have four equations in four unknowns (this can also be extended to more currents inside the contour):

$$I_0 + I_1 = A_0$$

$$z_0 I_0 + z_1 I_1 = A_1$$

$$z_0^2 I_0 + z_1^2 I_1 = A_2$$

$$z_0^3 I_0 + z_1^3 I_1 = A_3 \quad (5)$$

where $A_0$, $A_1$, $A_2$ and $A_3$ are constants computed from the sensor measurements around the contour. These are simple for the processor 108 to solve explicitly (in other embodiments the processor 108 may apply various iterative solutions as well). One example derivation of the explicit solution given before for the two current case is described in the next paragraph.

From equations (5), $$(z_1-z_0)I_1 = A_1 - z_0 A_0$$

$$z_1(z_1-z_0)A_1 = A_2 - z_0 A_1$$

$$z_1^2(z_1-z_0)I_1 = A_3 - z_0 A_2$$

Thus, $$z_1(A_1 - z_0 A_0) = A_2 - z_0 A_1$$

$$z_1(A_2 - z_0 A_1) = A_3 - z_0 A_2$$

Due to the symmetry of $z_0$ and $z_1$ in equations (5), they can be exchanged in the above:

$$z_0(A_1 - z_1 A_0) = A_2 - z_1 A_1$$

$$z_0(A_2 - z_1 A_1) = A_3 - z_1 A_2$$

Adding these pairwise yields $$A_1(z_0 + z_1) - 2A_0 z_0 z_1 = 2A_2 - A_1(z_0 + z_1)$$

$$A_2(z_0 + z_1) - 2A_1 z_0 z_1 = 2A_3 - A_2(z_0 + z_1),$$

i.e.

$$A_1(z_0 + z_1) - A_0 z_0 z_1 = A_2$$

$$A_1(z_0 + z_1) - A_1 z_0 z_1 = A_3$$

Now, let $p_1 = z_0 + z_1$ and $p_2 = -z_0 z_1$. Then $$\begin{pmatrix} p_1 \\ p_2 \end{pmatrix} = \begin{pmatrix} A_1 & A_0 \\ A_2 & A_1 \end{pmatrix}^{-1} \begin{pmatrix} A_2 \\ A_3 \end{pmatrix},$$

and $z_0$ and $z_1$ are the two roots of the quadratic polynomial $z^2 - p_1 z - p_2$.

The above integrals imply infinitely many sensor pairs 106, in practical implementations integrals are approximated with finite sums, implying finitely many sensors.

The number of sensors can be further reduced by interpolating values between them.

Two circle planes of sensors with a shared center and slight angle with respect to each other can also resolve currents which are not perpendicular to the plane of the clamp.

Looking back at the equation (3) and plugging in $z = Re^{i\varphi}$, the following may be obtained:

$$I_0 = \frac{R}{2\pi i}\oint \frac{M(Re^{i\varphi})}{Re^{i\varphi}} Rie^{i\varphi}d\varphi = \frac{R}{2\pi}\int_0^{2\pi} M(Re^{i\varphi})d\varphi,$$

since $I_0$ is real $$I_0 = \text{Re}\left(\frac{R}{2\pi}\int_0^{2\pi} M(Re^{i\varphi})d\varphi\right) = \frac{R}{2\pi}\int_0^{2\pi} V_1(Re^{i\varphi})d\varphi.$$

Thus, in some embodiments, only a single magnetic sensor measurement along the direction that is tangential to the contour may be needed to determine a single current inside the clamp and negate all the currents outside the clamp. However, to use the approach with the equations (4) to solve for multiple currents inside the contour, a measurement along an orthogonal direction is needed as well, for each sensor pair at each point.

While FIGS. 11-13 illustrate the closed contour 1124 as a circle, with the common reference point 1130 being the center of the circle, as described above this must not always be the case. For a generic closed contour (e.g. as shown in FIG. 5), an arbitrary point may be selected inside the contour as the "center of coordinates" for the purpose of calculations. Now locate orthogonal pairs of sensor measurement directions on the contour so that, for each sensor pair, one measurement direction is perpendicular to the line connecting the point of the center of the sensor pair to the selected common reference point and the other measurement direction is perpendicular to it. Then equation (2) still holds, except that R, which is the distance from the sensor to the origin, is now a function of z:

$$M(z, z_0, I_0) = \frac{I_0}{R(z)} \frac{z}{z - z_0} \qquad (6)$$

Thus, contribution of all currents is $$M(z) = V(z)_1 + iV'_1(z) = \qquad (7)$$
$$\frac{I_0}{R(z)} \frac{z}{z - z_0} + \frac{I_1}{R(z)} \frac{z}{z - z_1} + \frac{I_2}{R(z)} \frac{z}{z - z_2} + \frac{I_3}{R(z)} \frac{z}{z - z_3} + \dots ,$$

M(z) may not be meromorphic since R(z) may not be meromorphic, however M(z)R(z) is clearly meromorphic, so the same math applies for either single or multiple currents inside the clamp. For example equation (3) becomes $$I_0 = \frac{1}{2\pi i} \oint \frac{M(z)R(z)}{z} dz, \qquad (8)$$

and equations (4) become $$\frac{1}{2\pi i} \oint \frac{M(z)R(z)}{z} dz = I_0 + I_1 \qquad (9)$$
$$\frac{1}{2\pi i} \oint M(z)R(z) dz = z_0 I_0 + z_1 I_1$$
$$\frac{1}{2\pi i} \oint z M(z)R(z) dz = z_0^2 I_0 + z_1^2 I_1$$
$$\frac{1}{2\pi i} \oint z^2 M(z)R(z) dz = z_0^3 I_0 + z_1^3 I_1$$

In various embodiments, R(z) can be precomputed as a table value for each sensor pair, so it does not need to be computed in real time.

Now an implementation of the integral formulas (4) in a practical application will be described.

To this end, it would be illustrative to turn back to the example of FIG. 5, showing a generic contour 524 with a generic center of coordinates 530, with eight pairs of sensor pairs s located at discrete set of points on the contour. By the definition of a contour integral, first the contour may be parametrized. If the contour is convex, as shown in the example of FIG. 5, then it can be parametrized as a function of the argument of z (i.e. angle to the real axis):

$$z = C(\varphi) = R(\varphi)e^{i\varphi}, \varphi \in [0, 2\pi]$$

Then, the first integral of equations (4) becomes $$I_0 + I_1 = \frac{1}{2\pi i} \oint \frac{M(z)R(z)}{z} dz$$
$$= = \frac{1}{2\pi i} \int_0^{2\pi} \frac{M(R(\varphi)e^{i\varphi})R(\varphi)}{R(\varphi)e^{i\varphi}} (R'(\varphi)e^{i\varphi} + R(\varphi)ie^{i\varphi}) d\varphi$$
$$= = \frac{1}{\pi i} \int_0^{2\pi} M(R(\varphi)e^{i\varphi})(R'(\varphi) + iR(\varphi)) d\varphi.$$

It is now possible to approximate this integral using eight discrete points of sensor pair measurements, as in FIG. 5:

$$I_0 + I_1 \approx \frac{1}{2\pi i} \frac{2\pi}{8} \sum_{k=0}^{7} M(s_k)(R'(\varphi_k) + iR(\varphi_k))$$

This is simply a weighted sum of the eight complex magnetic measurements where, in some embodiments, the weights $R'(\varphi_k) + iR(\varphi_k)$ can be pre-computed and stored in a small table, e.g. stored in the memory 110. Similarly, equations in (4) may be transformed into:

$$I_0 + I_1 \approx \frac{1}{2\pi i} \frac{2\pi}{8} \sum_{k=0}^{7} M(s_k)(R'(\varphi_k) + iR(\varphi_k)) \qquad (10)$$

$$z_0 I_0 + z_1 I_1 \approx \frac{1}{2\pi i} \frac{2\pi}{8} \sum_{k=0}^{7} s_k M(s_k)(R'(\varphi_k) + iR(\varphi_k))$$

$$z_0^2 I_0 + z_1^2 I_1 \approx \frac{1}{2\pi i} \frac{2\pi}{8} \sum_{k=0}^{7} s_k^2 M(s_k)(R'(\varphi_k) + iR(\varphi_k))$$

$$z_0^3 I_0 + z_1^3 I_1 \approx \frac{1}{2\pi i} \frac{2\pi}{8} \sum_{k=0}^{7} s_k^3 M(s_k)(R'(\varphi_k) + iR(\varphi_k))$$

In the more common case of the contour being a circle of radius R, and center of coordinates being the center of this circle, R(z)=R is a constant, so its derivative is zero, thus equations (5) become $$I_0 + I_1 \approx \frac{R}{2\pi} \frac{2\pi}{8} \sum_{k=0}^{7} M(s_k) \qquad (11)$$

$$z_0 I_0 + z_1 I_1 \approx \frac{R}{2\pi} \frac{2\pi}{8} \sum_{k=0}^{7} s_k M(s_k)$$

$$z_0^2 I_0 + z_1^2 I_1 \approx \frac{R}{2\pi} \frac{2\pi}{8} \sum_{k=0}^{7} s_k^2 M(s_k)$$

$$z_0^3 I_0 + z_1^3 I_1 \approx \frac{R}{2\pi} \frac{2\pi}{8} \sum_{k=0}^{7} s_k^3 M(s_k)$$

The above derivations are shown as an example only. In practice, it is very likely that more than eight sensor pairs 106 may be needed in order to obtain current measurements with adequate precision (although the processor 108 could be configured to create more sensor pair measurements by interpolating between adjacent sensor pairs).

Further Examples of Sensor Arrangement and Methods

As previously described, embodiments disclosed herein may use magnetic sensors, e.g. AMR sensors, to measure current flow in one or more conductor wires, e.g. in a multi-conductor cable. Although not limited as such, assuming the multi-conductor cable is a 3-wire cable with one wire being ground and assuming the ground wire is not carrying current, there may be a total of eight variables to determine. In a situation where current is also being measured in a ground wire due, for example, to damage to the cable, there may be more than 8 variables.

The 8 variables include the x, y position of each conductor (e.g., each of the hot and the neutral conductors), the current flowing through each conductor, and the background magnetic field in the x and y directions. The background magnetic field may be due to Earth's magnetic field and/or a field from a wire that is nearby to the current measuring apparatus. To determine the values of the 8 variables, it is desirable to develop a configuration for the placement of the magnetic sensors in a defined fashion that yields the optimal field solving solution. One such non-limiting configuration is to position eight magnetic sensors in a circular fashion where each sensor senses the magnetic field strength in the X direction. These sensors can be placed on top of the PCB Board. Similarly, another eight magnetic sensors can be placed at the exact same location as the first eight sensors, but at the bottom of the printed circuit board (PCB) and oriented to measure the magnetic field strength in the Y direction. Together, a pair of such magnetic sensors at each location on the opposite sides of the PCB is an example of one of the magnetic sensor pairs 106, described above. This configuration yields 16 data points for eight x, y locations (i.e. eight magnetic sensor pairs 106) where magnetic field strengths can be measured. In some embodiments of one or more of such magnetic sensor pairs 106, the location of the sensors for measuring the x-component of the magnetic field and the location of the sensors for measuring the y-component of the magnetic field may differ from each other.

Figures 14A, 14B:
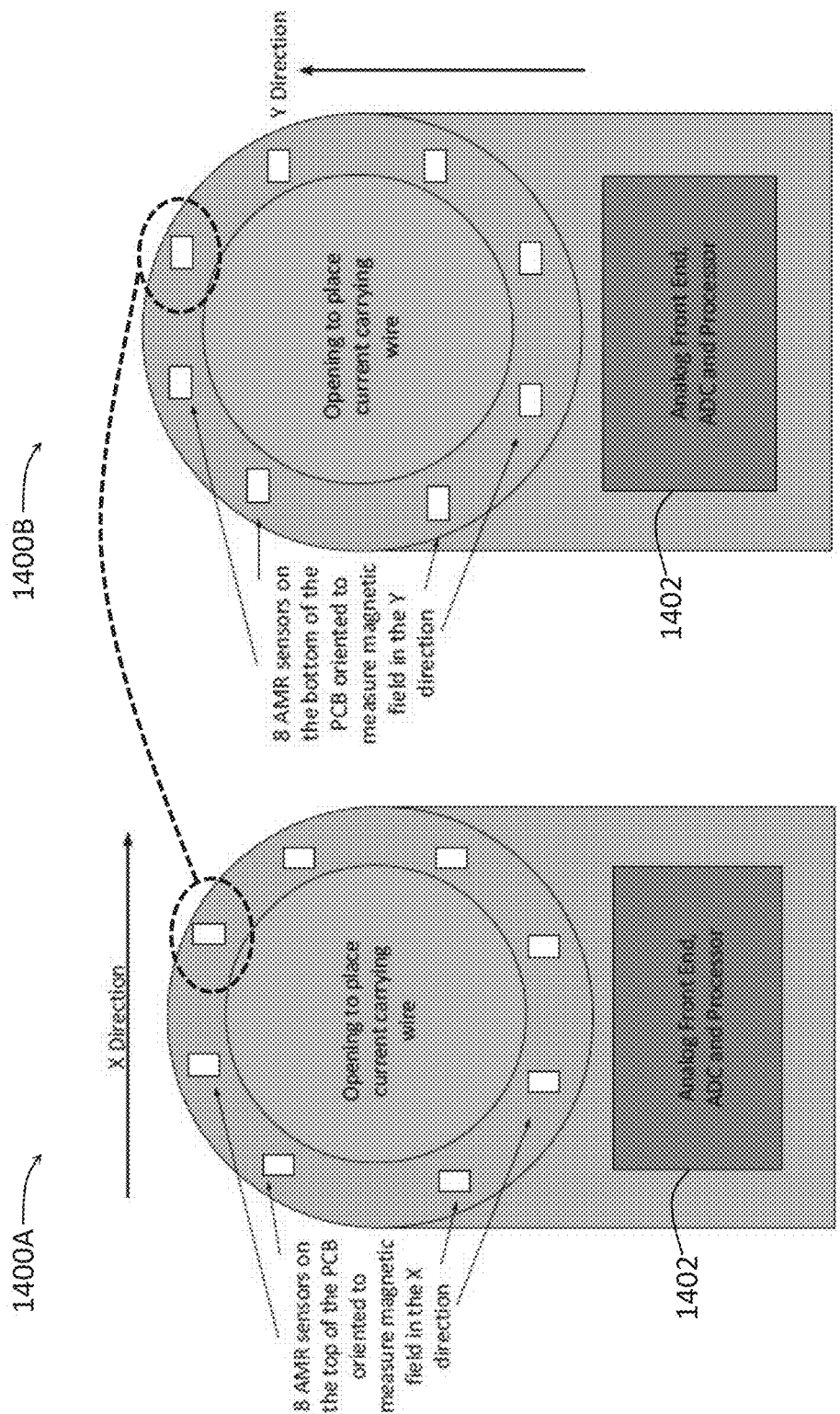
FIGS. 14A and 14B provide an example of arrangements of first and second sets of sensors on different sides of a housing of a current-measurement apparatus, according to some embodiments of the present disclosure.

FIGS. 14A and 14B illustrate an example placement of sensors within an example apparatus for measuring current in accordance with certain embodiments. As illustrated in FIG. 14A, a first set of eight sensor circuits may be positioned on one side, such as, but not necessarily, a top-side 1400A, of the PCB of a current measuring apparatus, such as e.g. the current measurement apparatus 200 or any other apparatus that may be included as a part of the current measurement system 100, e.g. as the current measurement unit 104 of the current measurement system 100. This first set of eight sensors circuits may each be oriented to measure a magnetic field in an x-direction. Similarly, as illustrated in FIG. 14B, a second set of eight sensor circuits may be positioned on the opposite side, such as, but not necessarily, a bottom-side 1400B, of the PCB of said current measuring apparatus. The sensor circuits of the second set of eight sensors circuits may each be oriented to measure a magnetic field in a y-direction. As is shown in FIGS. 14A and 14B with two example sensor circuits (one from each FIG.) circled in a dashed line and with another dashed line connecting these two sensor circuits, a sensor circuit on one side 1400A (i.e. a sensor circuit from the first set of sensor circuits) and a corresponding sensor circuit on the other side 1400B (i.e. a sensor circuit from the second set of sensor circuits) together form an example of the magnetic sensor pair 106 as described above. Thus, unless specified otherwise, descriptions provided above are applicable to the arrangements shown in FIGS. 14A and 14B.

In some embodiments, the second set of eight sensor circuits may be positioned orthogonally from the first set of eight sensor circuits. Although, as described above, it is possible in some embodiments for the first and second set of sensor circuits to be positioned non-orthogonally to each other, positioning the sensor circuits non-orthogonally can increase the complexity of measuring the magnetic fields. As illustrated in FIGS. 14A and 14B, the sensors circuits can measure the field strength in an x-direction of a coordinate plane and a y-direction of a coordinate plane when a wire is positioned within a target measurement zone of a housing of the current measurement apparatus. The wire may extend in a z-direction that points out of the drawing sheet towards a viewer of the drawing sheet.

In some embodiments, the first set of sensor circuits and the second set of sensor circuits may be positioned at substantially the same location on the PCB, but on opposite sides, as shown in FIGS. 14A and 14B. However, in some embodiments, the first set of sensor circuits and the second set of sensor circuits may be positioned at different locations, either on the same or on different sides of the housing, e.g. of the PCB. In some embodiments, each of the sensor circuits may include a plurality of sensors, such as 4 sensors in a Wheatstone bridge configuration. Thus, for the example of FIGS. 14A and 14B, there may be 32 sensors positioned on each side of the PCB to measure the x and y components of the magnetic field produced by one or more of the conductor wires and/or the background field.

In certain embodiments disclosed herein, the sensor circuits can be positioned symmetrically on the housing/PCB or symmetrically around a target measurement area. In other embodiments, the sensor circuits may be positioned at various locations to improve or maximize the accuracy of the sensor measurements.

Sixteen magnetic field measurements may be obtained from the two sets of eight sensor circuits. Each of the sixteen magnetic field measurements can be a non-linear function of the eight variables mentioned earlier for the example of two conductor wires carrying current, e.g. for the example of a two-wire cable or a three-wire cable with a ground wire (e.g., the x, y location of each conductor with a current flow, the current flow of each of the two conductors, and the background magnetic field in the x and y directions). Each of the sixteen magnetic sensors of 8 magnetic sensor pairs 106 can be used with an Analog Front End and an ADC to transmit the field measurements to a processor (Analog Front End, ADC, and Processor shown in FIGS. 14A and 14B in a block 1402), e.g. the processor 108, that processes the measurements as described herein. The ADC can sample the sensor output at a relatively fast rate to provide a continuous stream of data from each sensor or sensor circuit. In certain embodiments, the processor 108 may use non-linear least square solving techniques to extract the values for the eight variables from the sixteen magnetic field strength measurements. Moreover, in certain embodiments, the processor 108 may use a successive approximation method to minimize the error between the sixteen measurements for the field strengths and a set of predicted field strengths that are predicted based on a predicted x, y location of each conductor, a predicted current flow of each conductor and the background fields. The existence of a local minimizer for the error may be based on the fact that the measurements originated from two opposing current flows in a multi-conductor cable or in any multiple conductor wires.

In some embodiments, the processor 108 may use a number of non-linear least square fit operations to derive the solution and determine values for the variables. One main metric may be to utilize the least number of time steps to achieve the smallest error and converge quickly. One method that can be used by the processor 108 to derive the solution is the Steepest Descent Method, which has very good performance in the first few iterative steps, but its final settling may be linear and slow. Another method that may be used by the processor 108 is the Newton Method, which is very good in the final stages of the iterative process when the predicted value is close to the solution. Another possible approach is for the processor 108 to use a hybrid operation that can initially use the Steepest Descent method and then use the Newton method when close to final settling. The challenge with such hybrid operations is to develop robust switch over operations that are not overly computational complex. In other embodiments, the processor 108 can use versions of the Levenberg-Marquardt method and the Powell's Dog Leg method, or versions of the damped Gauss-Newton method for solving non-linear least square problems. These methods are often considered as the best methods for solving non-linear least square fit problems with the fastest convergence times for such applications.

FIG. 15 presents an example of the Levenberg-Marquardt operation that can be used with a current measurement process, such as the process 1600 described below or the processes 900 or 1000 described above, for the processor 108 to solve for one or more variables when determining current flow within one or more conductor wires. Combining these non-linear solvers with magnetic sensor pairs based contactless current sensing delivers a solution for multi-conductor current sensing for which no adequate solution exists today.

Figure 16:
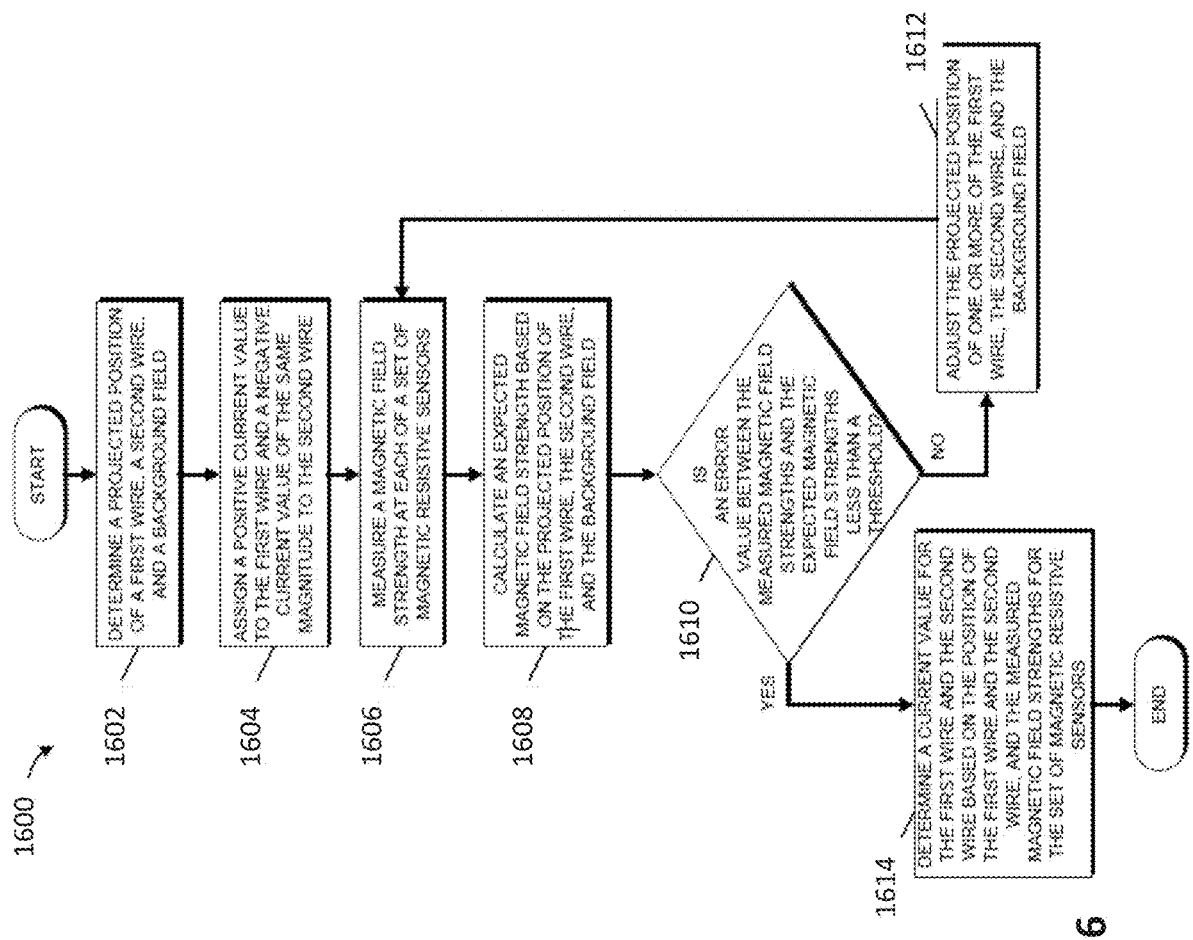
FIG. 16 presents a flowchart of an example process of determining current flow through at least one conductor wire according to yet another embodiment of the present disclosure.

FIG. 16 presents a flowchart of an example current measurement process 1600 for determining current flow through at least one conductor wire according to yet another embodiment of the present disclosure. The process 1600 can be implemented by any current measurement system that can measure the amount of current flowing through one or more wires. The process 1600, in whole or in part, can be implemented using, for example, the mobile current measurement apparatus 102, the current measurement unit 104, one or more processors 108, the sensor pairs 106, and the like. The process 1600 may be performed in response to a wire being positioned within an opening of the current measuring apparatus 102, positioned within a target measurement zone of the current measuring apparatus 102, a command from a user, or any other trigger that may initiate measurement of a current in a wire. In some embodiments, the current measuring apparatus 102 may be permanent or affixed to a component enabling continuous or intermittent monitoring of current in a wire or a device. In some such embodiments, the process 1600 may be performed intermittently or continuously. Although a number of different systems can perform some or all of the process 1600, to simplify discussion, the process 1600 will be described with respect to particular systems.

The process 1600 may begin at block 1602 where, for example, the processor 108 determines a projected position of the first conductor wire, a second conductor wire, and a background field. In some embodiments, the first wire and the second wire may be part of a multi-conductor cable. In other words, in some cases, the first wire may be a hot wire and the second wire may be a neutral wire within a Romex® wire. In some embodiments, the initial projected position of the first wire and the second wire may be the center of a target measurement area of a current measurement apparatus. In some embodiments, the initial projected position of the first wire and the second wire may on average be the center of the target measurement area. Because there are multiple wires, it may, in some cases, not be possible for both wires to be positioned at the center of the target measurement area. Accordingly, each of the first wire and the second wire may be equally offset, but in opposite directions, from the center of the target measurement area such that the averaged or summed locations of the two wires is at the center of the target measurement area.

At block 1604, the processor 108 may assign a positive current value to the first wire and a negative current value of the same magnitude to the second wire, or vice versa. For example, the current assigned to the first wire may be one amp (1 A) and the current assigned to the second wire may be negative one amp (−1 A).

At block 1606, the processor 108, using the sensor pairs 106, may measure a magnetic field strength at each of the set of magnetic resistive sensors (e.g. the processor 108 may control the measurement process carried out by the sensor pairs 106 and receive results of the measurements). In certain embodiments, each of the sensor pairs 106 may be used to determine an x, y magnetic field strength at a particular location.

At block 1608, the processor 108 may calculate an expected magnetic field strength at each sensor based on the projected position of the first wire, the second wire, and the background field. Further, the block 1608 may involve the processor 108 calculating the expected magnetic field strength based on the assigned current values assigned at the block 1604 for current flowing through the first wire and second wire. As a hypothetical current and a position are assigned to each wire, it is possible to determine an expected magnetic field strength to be measured by each sensor. If the hypothetical current and position of each wire matches the actual current and position of each wire, the calculated or expected magnetic field strength should match the measured field strength determined at the block 1606. A difference between the measured and expected magnetic field strengths of each sensor may be determined as an error value. In some embodiments, the processor 108 may calculate a separate error value for the magnetic field strength measured at each magnetic sensor. In other embodiments, the processor 108 may determine an aggregate error value, or an error value that reflects the total error of the magnetic field strength, by, for example, taking a differential between the calculated expected magnetic field strength and the measured magnetic field strength of the set of magnetic resistive sensors.

At decision block 1610, the processor 108 may determine whether an error value between the measured magnetic field strengths and the expected magnetic field strengths is less than a threshold. The threshold may be set by a user or by a manufacturer of the current measurement apparatus. In certain embodiments, the decision block 1610 may involve the processor 108 determining whether the error value is at a minima or minimum point. Because the current assigned to the wire as part of the block 1604 may not match the actual current in the wire, it may not be possible to obtain an error that satisfies the threshold. However, by determining the point where the error is at a minimum, the location of the conductor wires (e.g. the location of the multi-conductor cable) within the target measurement area can be determined by the processor 108. Once the location is determined within the target measurement area, the processor 108 may determine the current flowing through the first wire and the second wire, based at least in part on the strength of the magnetic field measured at the determined location. In some embodiments, determining whether the error value is less than a threshold comprises the processor 108 determining a root mean square sum of errors measured between the output of the sensors and the expected output of the sensors. It can then be determined whether the root mean square sum is less than, or satisfies, the threshold.

If the processor 108 determines at the decision block 1610 that the error value is not less than the threshold or does not satisfy a threshold, then the process 1600 may proceed to the block 1612. At the block 1612, the processor 108 may adjust the projected position of one or more of the first wire, the second wire, and/or the background field. In some embodiments, the process may then return to the block 1606 (as shown in FIG. 16 with an arrow from the block 1612 to the block 1606) where the magnetic field strength at each of the set of magnetic resistive sensors is measured again. At the block 1608, the processor 108 may recalculate the expected magnetic field strength based on the updated projected position of one or more of the first wire, the second wire, and the background field. Advantageously, in certain embodiments, by repeating the process associated with the block 1606, movement of the current measuring apparatus, for example due to shaking or other movement of the operator's hand, during the measurement process can be accounted for in the determination of the current within one or more conductor wires. Alternatively, in certain embodiments, the process 1600 may proceed from the block 1612 to the block 1608, i.e. skip performing the measurements again (not specifically shown in FIG. 16 with an arrow from the block 1612 to the block 1608). In some such embodiments, the measured magnetic field strength previously obtained during performance of the process 1600 may be used during performance of the decision block 1610.

If the processor 108 determines at the decision block 1610 that the error value is less than the threshold or does satisfy a threshold, the process 1600 may proceed to the block 1614. At the block 1614, the processor 108 may determine a current value for the first wire and the second wire based at least in part on the position of the first wire and the second wire and the measured magnetic field strengths for the set of magnetic sensors 106. In certain embodiments, determining the current value for the first wire and the second wire may include repeating a modified version of the process 1600 using the known location, as determined using embodiments of the process 1600, of the first wire and the second wire within the target measurement area while varying the current value applied to the first wire and the second wire. Upon determining the current value that provides the minimum error, the current value may be displayed to a user on a display or conveyed to a user using any kind of an output device, e.g. the output device 114, of the current measurement apparatus 102.

Descriptions of the method 1600 may be extended to any other number of conductor wires and any arrangements of the magnetic sensor pairs 106, all of which being within the scope of the present disclosure.

Select Examples

Example 1 provides an apparatus for measuring current flow through at least one conductor wire. The apparatus may include a housing having an opening for receiving the at least one wire. The opening may correspond to a target measurement zone for measuring a current flowing through one or more conductor wires, e.g. in a multi-conductor cable, when the conductor wires are positioned within the opening. The apparatus may further include a plurality of magnetic sensor pairs, and a hardware processor. The plurality of magnetic sensor pairs may be arranged within the housing (i.e. arranged on or at least partially in the housing), e.g. positioned around the opening of the housing. The one or more conductor wires may extend in a z-direction (when positioned within the opening), while the plurality of magnetic sensor pairs may be positions in one or more x-y planes of a three-dimensional coordinate system. Each magnetic sensor pair may be configured to generate signals when the at least one wire extends through the opening (e.g. when at least a portion of the wire is positioned within the opening), said signals including a first signal (e.g. a first voltage or a first current) indicative of a magnetic field in a first direction, and a second signal (e.g. a second voltage or a first current) indicative of a magnetic field in a second direction. The hardware processor may be configured to derive a measure of a current in (a current that may be flowing through) the at least one wire based on the signals generated by at least two or more of the plurality of magnetic sensor pairs.

Example 2 provides the apparatus according to Example 1, where the first direction is substantially perpendicular to the second direction for all magnetic sensor pairs.

Example 3 provides the apparatus according to Examples 1 or 2, where each of the plurality of magnetic sensor pairs is arranged with respect to a common reference point so that, for each magnetic sensor pair the first direction is substantially perpendicular to a line connecting a sensor reference point (e.g. a magnetic center) of the magnetic sensor pair and the common reference point, and the second direction is substantially parallel to said line.

Example 4 provides the apparatus according to any one of the preceding Examples, where a relation between the first direction and the second direction is the same for all of the plurality of magnetic sensor pairs.

Example 5 provides the apparatus according to Example 4, where the relation between the first direction and the second direction is that the second direction points away from the common reference point and the first direction is a clockwise 90 degrees rotation of the second direction.

Example 6 provides the apparatus according to Example 4, where the relation between the first direction and the second direction is that the second direction points away from the common reference point and the first direction is a counterclockwise 90 degrees rotation of the second direction.

Example 7 provides the apparatus according to Example 4, where the relation between the first direction and the second direction is that the second direction points towards the common reference point and the first direction is a clockwise 90 degrees rotation of the second direction.

Example 8 provides the apparatus according to Example 4, where the relation between the first direction and the second direction is that the second direction points towards the common reference point and the first direction is a counterclockwise 90 degrees rotation of the second direction.

Example 9 provides the apparatus according to Example 1, where the two or more magnetic sensor pairs (i.e. the sensor pairs signals of which are used to derive a measure of current in the at least one wire) include a first magnetic sensor pair and a second magnetic sensor pair. Both magnetic sensor pairs may be arranged with respect to a common reference point (e.g., reference point 630, shown in FIG. 6) so that, for the first magnetic sensor pair (e.g., magnetic sensor pair $s_3$, shown in FIG. 6), the first direction of the first magnetic sensor pair is at a first angle (e.g., angle $\alpha_3$, shown in FIG. 6) with respect to a line connecting a sensor reference point (e.g. a magnetic center) of the first magnetic sensor pair and the common reference point, and the second direction of the first magnetic sensor pair is substantially perpendicular to the first direction of the first magnetic sensor pair and is at a second angle (e.g., angle $\theta_3$, shown in FIG. 6) with respect to the line connecting the sensor reference point of the first magnetic sensor pair and the common reference point, and, for the second magnetic sensor pair (e.g., magnetic sensor pair $s_4$, shown in FIG. 6), the first direction of the second magnetic sensor pair is at a third angle (e.g., angle $\alpha_4$, shown in FIG. 6) with respect to a line connecting a sensor reference point (e.g. a magnetic center) of the second magnetic sensor pair and the common reference point, and the second direction of the second magnetic sensor pair is substantially perpendicular to the first direction of the second magnetic sensor pair and is at a fourth angle (e.g., angle $\theta_4$, shown in FIG. 6) with respect to the line connecting the sensor reference point of the second magnetic sensor pair and the common reference point.

Example 10 provides the apparatus according to Example 9, where when the first angle is not equal to the third angle and is not equal to the fourth angle, the hardware processor is configured to compensate for a difference between the first angle and the third angle or compensate for a difference between the first angle and the fourth angle prior to or when deriving the measure of the current in the at least one wire based on the signals generated by the first magnetic sensor and the second magnetic sensor.

Example 11 provides the apparatus according to Example 9, where when none of the first angle and the second angle is equal to zero, the hardware processor is configured to compensate for a deviation of the first direction or the second direction of the first magnetic sensor from being parallel to the line connecting the sensor reference point of the first magnetic sensor and the common reference point prior to or when deriving the measure of the current in the at least one wire based on the signals generated by the first magnetic sensor.

Example 12 provides the apparatus according to Example 11, where when none of the third angle and the fourth angle is equal to zero, the hardware processor is configured to compensate for a deviation of the first direction or the second direction of the second magnetic sensor from being parallel to the line connecting the sensor reference point of the second magnetic sensor and the common reference point prior to or when deriving the measure of the current in the at least one wire based on the signals generated by the second magnetic sensor.

Example 13 provides the apparatus according to any one of the preceding Examples, where the plurality of magnetic sensor pairs are arranged substantially uniformly along an imaginary or hypothetical closed contour.

Example 14 provides the apparatus according to Example 13, where the closed contour is substantially a circle, an ellipse, or a quadrilateral.

Example 15 provides the apparatus according to any one of Examples 1-14, where each of one or more of the plurality of magnetic sensor pairs includes a first and a second sensors, the first sensor configured to generate the first signal and the second sensor configured to generate the second signal.

Example 16 provides the apparatus according to Example 15, where the housing has a first face and an opposite second face, the first magnetic sensor of each of one or more of the plurality of magnetic sensor pairs is provided on the first face of the housing, and the second magnetic sensor of each of one or more of the plurality of magnetic sensor pairs is provided on the second face of the housing.

Example 17 provides the apparatus according to Example 15, where, for each of one or more of the plurality of magnetic sensor pairs, the first magnetic sensor is separated from the second magnetic sensor by a gap (i.e. the first and second magnetic sensors of each magnetic sensor pair are provided within the housing at a distance from one another).

Example 18 provides the apparatus according to Example 15, where the first magnetic sensors of the plurality of magnetic sensor pairs and interleaved with the second magnetic sensors of the plurality of magnetic sensor pairs.

Example 19 provides the apparatus according to any one of Examples 1-14, where each of one or more of the plurality of magnetic sensor pairs includes a multi-axis sensor.

Example 20 provides the apparatus according to any one of Examples 1-19, where the plurality of magnetic sensor pairs includes Hall effect sensors.

Example 21 provides the apparatus according to any one of Examples 1-19, where the plurality of magnetic sensor pairs includes anisotropic magnetoresistance sensors (AMRs).

Example 22 provides the apparatus according to any one of Examples 1-19, where the plurality of magnetic sensor pairs includes giant magnetoresistance sensors (GMRs).

Example 23 provides the apparatus according to any one of Examples 1-19, where the plurality of magnetic sensor pairs includes tunnel magnetoresistance sensors (TMRs).

Example 24 provides the apparatus according to any one of Examples 1-19, where the plurality of magnetic sensor pairs includes magneto-optical sensors.

Example 25 provides the apparatus according to any one of Examples 1-19, where the plurality of magnetic sensor pairs includes superconductor current sensors.

Example 26 provides the apparatus according to any one of the preceding Examples, where the at least one wire is a first wire, each magnetic sensor pair of the plurality of magnetic sensor pairs is configured to generate the signals when both the first wire and a second wire extend through the opening, and the hardware processor is further configured to derive a measure of a current in the second wire based on the signals generated by at least two or more of the plurality of magnetic sensor pairs.

Example 27 provides the apparatus according to Example 26, further including a display unit configured to display a graphical representation of the measure of the current in the second wire and the measure of the current in the first wire derived by the data processing system.

Example 28 provides the apparatus according to Example 27, where the display unit is further configured to display relative locations (i.e. locations with respect to one another or with respect to some common reference point) of the first wire and the second wire.

Example 29 provides the apparatus according to any one of the preceding Examples, further including an output device configured to display a graphical representation of the measure of the current in the at least one wire derived by the hardware processor.

In further Examples, the apparatus may include a processor configured to assign a projected position of a first wire and a second wire of the one or more conductor wires (e.g. of a multi-conductor cable) within the target measurement zone; calculate an expected magnetic field strength for the first wire and the second wire in the x-direction and the y-direction based at least in part on the projected position of the first wire and the second wire with respect to each of the first set of sensor circuits and the second set of sensor circuits; measure (or control the magnetic sensor pairs to measure) the magnetic field strength in the x-direction and the y-direction using each of the first set of sensor circuits and the second set of sensor circuits as described herein; determine an error value based on a difference between the expected magnetic field strength in the x-direction and the y-direction and the measured magnetic field strength in the x-direction and the y-direction; successively adjust the projected position of the first wire and the second wire until the error value satisfies an error threshold; and determine a current flowing through the first wire and the second wire based at least in part on the projected position of the first wire and the second wire when the error value satisfies the error threshold and the measured magnetic field strength in the x-direction and the y-direction.

In certain further Examples, each sensor circuit of the first set of sensor circuits and each sensor circuit of the second set of sensor circuits may include four magnetic sensors configured in a Wheatstone bridge. Alternatively, each sensor circuit of the first set of sensor circuits and each sensor circuit of the second set of sensor circuits may include two magnetic sensors configured in a half-Wheatstone bridge. Each sensor circuit of the first set of sensor circuits and each sensor circuit of the second set of sensor circuits may include one or more AMR sensors. In certain Examples, the processor may be further configured to determine the error value by determining a root mean square sum of errors between the expected magnetic field strength and the measured magnetic field strength with respect to each of the first set of sensor circuits and the second set of sensor circuits. Moreover, in certain Examples, the processor may be further configured to determine whether the error value satisfies the error threshold by determining whether the root mean square sum of errors satisfies the error threshold.

Example 30 provides a method for operating an apparatus for measuring current flow through at least one conductor wire. The method may include enclosing the wire within an opening in a housing of the apparatus so that the wire extends through the opening (i.e. at least a portion of the wire is positioned within the opening), where the opening is for receiving one or more conductor wires and the housing includes a plurality of magnetic sensor pairs arranged therein or thereon (e.g. arranged around the opening of the housing); using a hardware processor of the apparatus to receive signals generated by the plurality of magnetic sensor pairs while the wire is enclosed within the opening, where the signals generated by each magnetic sensor pair of the plurality of magnetic sensor pairs include a first signal (e.g. a first voltage or a first current) indicative of a magnetic field in a first direction, and a second signal (e.g. a second voltage or a first current) indicative of a magnetic field in a second direction; and using the hardware processor to derive a measure of a current in the wire based on the signals generated by at least two or more of the plurality of magnetic sensor pairs.

Example 31 provides the method according to Example 30, where the wire is a first wire and where the method is further for determining current in a second wire, the method further including enclosing the second conductor with the opening so that the second wire extends through the opening (e.g. at least a portion of the second wire is positioned within the opening); using the hardware processor to receive signals generated by the plurality of magnetic sensor pairs while both the first wire and the second wire are enclosed with the opening; and using the hardware processor to derive a measure of a current in the second wire based on the signals generated by at least two or more of the plurality of magnetic sensor pairs.

In further Examples, the method according to any one of claims 30-31 may further include features for operating an apparatus according to any one of the preceding Examples, e.g. any one of Examples 1-29.

Example 32 provides a method for determining current in a conductor wire, the method including causing a plurality of magnetic sensor pairs arranged within a housing having an opening for receiving one or more wires to generate signals when the wire extends through the opening (e.g. when at least a portion of the wire is positioned within the opening), the signals from each magnetic sensor pair of the plurality of magnetic sensor pairs including a first signal (e.g. a first voltage or a first current) indicative of a magnetic field in a first direction, and a second signal (e.g. a second voltage or a first current) indicative of a magnetic field in a second direction; and using a hardware processor to derive a measure of a current in the wire based on the signals generated by at least two or more of the plurality of magnetic sensor pairs.

Example 33 provides a method for determining current in a conductor wire, the method including receiving signals generated by a plurality of magnetic sensor pairs arranged within a housing having an opening for receiving one or more conductor wires, where said signals are generated while the wire extends through the opening (e.g. when at least a portion of the wire is positioned within the opening), and where the signals from each magnetic sensor pair of the plurality of magnetic sensor pairs include a first signal (e.g. a first voltage or a first current) indicative of a magnetic field in a first direction, and a second signal (e.g. a second voltage or a first current) indicative of a magnetic field in a second direction; and deriving a measure of a current in the wire based on the signals generated by at least two or more of the plurality of magnetic sensor pairs.

In further Examples, the method according to any one of claims 32-33 may further include features for determining current in an apparatus according to any one of the preceding Examples, e.g. any one of Examples 1-29.

Example 34 provides an apparatus for measuring current flow through a multi-conductor cable, the apparatus including a housing comprising an opening configured to receive a multi-conductor cable; first magnetic sensors arranged around the opening and configured to measure magnetic field strength in a first direction; second magnetic sensors arranged around the opening and configured to measure magnetic field strength in a second direction; and a hardware processor configured to determine current flowing through a single conductor of the multi-conductor cable based on outputs from the first magnetic sensors and the second magnetic sensors.

Example 35 provides the apparatus according to Example 34, where the processor is further configured to determine current flowing through a second individual conductor of the multi-conductor cable based on the outputs from the first magnetic sensors and the second magnetic sensors.

Example 36 provides the apparatus according to Example 34, where the first magnetic sensors comprise anisotropic magnetoresistive sensors.

Example 37 provides the apparatus according to Example 34, where the processor is configured to determine the current flowing through the single conductor based on non-linear operations for calculating the current flowing through the single wire.

Example 38 provides the apparatus according to Example 34, where the processor is configured to determine the current flowing through the single conductor based at least in part on a least square fit operation.

Example 39 provides the apparatus according to Example 34, further including an analog front end and an analog-to-digital converter in a signal path between a magnetic sensor of the first magnetic sensors and the processor.

Example 40 provides the apparatus according to Example 34, where the first direction is substantially orthogonal to the second direction.

Example 41 provides the apparatus according to Example 34, where the first magnetic sensors and the second magnetic sensors are disposed within the housing.

Example 42 provides the apparatus according to Example 34, where the first magnetic sensors comprise four magnetic sensors.

Example 43 provides the apparatus according to Example 42, where the four magnetic sensors are disposed in a Wheatstone bridge configuration.

Example 44 provides the apparatus according to Example 34, where the processor is configured to determine the current flowing through the single conductor based at least in part on a determination of one or more magnetic field strengths measured by at least some of the first magnetic sensors and the second magnetic sensors, and a determination of a location of the single conductor within a target measurement area.

Example 45 provides a method of measuring current flowing through a multi-conductor cable, the method including: determining a projected position of a first wire and a second wire of a multi-conductor cable within a target measurement zone; assigning a first projected current value to the first wire and a second projected current value to the second wire; measuring a magnetic field strength of a magnetic field generated by a first current flowing through the first wire and a second current flowing through the second wire, wherein the magnetic field strength is measured using a set of magnetic sensors arranged around the target measurement zone; determining an expected magnetic field strength based at least in part on the projected position of the first wire and the projected position of the second wire; determining an error value based at least in part on the measured magnetic field strength and the expected magnetic field strength; adjusting the projected position of the first wire when it is determined that the error value does not satisfy an error threshold; and determining a current value for the first current flowing through the first wire based at least in part on the projected position of the first wire and the magnetic field strength when it is determined that the error value does satisfy the error threshold.

Example 46 provides the method according to Example 45, where the multi-conductor cable comprises at least two wires, e.g. at least three wires.

Example 47 provides the method according to Example 45, where the first projected current value and the second projected current value have the same magnitude, but opposite phase.

Example 48 provides the method according to Example 45, where the magnetic field is an aggregate of a first magnetic field generated by the first current flowing through the first wire and or a second magnetic field generated by the second current flowing through the second wire.

Example 49 provides the method according to Example 45, further including adjusting the projected position of the second wire when it is determined that the error value does not satisfy the error threshold.

Example 50 provides the method according to Example 45, further including determining a second current value for the second current flowing through the second wire based at least in part on the projected position of the second wire and the magnetic field strength when it is determined that the error value does satisfy the error threshold.

Example 51 provides the method according to Example 45, where the set of magnetic sensors comprise first magnetic sensors and second magnetic sensors, and wherein the first magnetic sensors are configured to measure the magnetic field strength in a first direction and the second magnetic sensors are configured to measure the magnetic field strength in a second direction.

Example 52 provides the method according to Example 45, where determining the projected position of the first wire and the second wire of the multi-conductor cable comprises assigning a first default position to the first wire and a second default position to the second wire.

Example 53 provides the method according to Example 45, further including performing a least square fit operation to determine the projected position of the first wire at a point where the error value satisfies the error threshold.

OTHER IMPLEMENTATION NOTES, VARIATIONS, AND APPLICATIONS

Principles and advantages discussed herein can be used in any device to measure the current flowing through one or more conductor wires. Further, embodiments disclosed herein can be used to increase a zone or area in which a conductor wire can be located during measurement of the current flowing through the wire, thereby making it possible to measure the current in wires that are awkwardly positioned or are blocked by other components. Further, embodiments disclosed herein improve the accuracy of the current measurement and/or reduce the impact of stray field interference on the current measurement in the wire(s). The embodiments discussed herein can be implemented to measure current in a variety of systems, including systems related to residential electrical systems, electric vehicles, solar energy, power storage, or other systems in which it can be desirable to measure current in one or more conductor wires, e.g. in a multi-conductor cable, in a contactless manner.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGS. may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGS. and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to contactless current measurement using magnetic sensors, e.g. those summarized in the one or more processes shown in FIGS., illustrate only some of the possible functions that may be executed by, or within, the current measurement systems illustrated in the FIGS. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. An apparatus for measuring current flow through at least one wire, the apparatus comprising:
   a housing comprising an opening for receiving the at least one wire;
   a plurality of magnetic sensor pairs arranged along a contour within the housing, each magnetic sensor pair configured to generate signals when the at least one wire that carries current extends through the opening, the signals including:
      a first signal indicative of a magnetic field in a first direction, and
      a second signal indicative of a magnetic field in a second direction; and
   a hardware processor configured to:
      compute a plurality of constants related to integrals around the contour, where the constants are computed based on the signals generated by two or more of the plurality of magnetic sensor pairs, and
      derive a measure of current in the at least one wire based on the constants.

2. The apparatus according to claim 1, wherein the first direction is perpendicular to the second direction.

3. The apparatus according to claim 1, wherein each of the plurality of magnetic sensor pairs is arranged with respect to a common reference point so that, for each magnetic sensor pair:
   the first direction is perpendicular to a line connecting a sensor reference point of the magnetic sensor pair and the common reference point, and
   the second direction is parallel to said line.

4. The apparatus according to claim 3, wherein a relation between the first direction and the second direction is the same for all of the plurality of magnetic sensor pairs.

5. The apparatus according to claim 4, wherein the relation between the first direction and the second direction is that the second direction points away from the common reference point and the first direction is a clockwise 90 degrees rotation of the second direction.

6. The apparatus according to claim 4, wherein the relation between the first direction and the second direction is that the second direction points away from the common reference point and the first direction is a counterclockwise 90 degrees rotation of the second direction.

7. The apparatus according to claim 4, wherein the relation between the first direction and the second direction is that the second direction points towards the common reference point and the first direction is a clockwise 90 degrees rotation of the second direction.

8. The apparatus according to claim 4, wherein the relation between the first direction and the second direction is that the second direction points towards the common reference point and the first direction is a counterclockwise 90 degrees rotation of the second direction.

9. The apparatus according to claim 1, wherein the two or more magnetic sensor pairs include a first magnetic sensor pair and a second magnetic sensor pair, both arranged with respect to a common reference point so that,
for the first magnetic sensor pair, the first direction is at a first angle with respect to a line connecting a sensor reference point of the first magnetic sensor pair and the common reference point, and the second direction is perpendicular to the first direction and is at a second angle with respect to the line connecting the sensor reference point of the first magnetic sensor pair and the common reference point, and,
for the second magnetic sensor pair, the first direction is at a third angle with respect to a line connecting a sensor reference point of the second magnetic sensor pair and the common reference point, and the second direction is perpendicular to the first direction and is at a fourth angle with respect to the line connecting the sensor reference point of the second magnetic sensor pair and the common reference point.

10. The apparatus according to claim 9, wherein:
when the first angle is not equal to the third angle and is not equal to the fourth angle, the hardware processor is configured to compensate for a difference between the first angle and the third angle or compensate for a difference between the first angle and the fourth angle prior to or when deriving the measure of the current in the at least one wire.

11. The apparatus according to claim 9, wherein:
when none of the first angle and the second angle is equal to zero, the hardware processor is configured to compensate for a deviation of the first direction or the second direction of the first magnetic sensor pair from being parallel to the line connecting the sensor reference point of the first magnetic sensor pair and the common reference point prior to or when deriving the measure of the current in the at least one wire.

12. The apparatus according to claim 11, wherein:
when none of the third angle and the fourth angle is equal to zero, the hardware processor is configured to compensate for a deviation of the first direction or the second direction of the second magnetic sensor pair from being parallel to the line connecting the sensor reference point of the second magnetic sensor pair and the common reference point prior to or when deriving the measure of the current in the at least one wire.

13. The apparatus according to claim 1, wherein each magnetic sensor pair of one or more of the plurality of magnetic sensor pairs includes a first and a second magnetic sensors, the first magnetic sensor configured to generate the first signal and the second magnetic sensor configured to generate the second signal.

14. The apparatus according to claim 13, wherein:
the housing has a first face and an opposite second face,
the first magnetic sensor of the each magnetic sensor pair of one or more of the plurality of magnetic sensor pairs is provided on the first face of the housing, and
the second magnetic sensor of the each magnetic sensor pair of one or more of the plurality of magnetic sensor pairs is provided on the second face of the housing.

15. The apparatus according to claim 1, wherein each magnetic sensor pair of one or more of the plurality of magnetic sensor pairs includes a multi-axis magnetic sensor.

16. The apparatus according to claim 1, wherein:
the at least one wire is a first wire,
each magnetic sensor pair of the plurality of magnetic sensor pairs is configured to generate the signals when both the first wire and a second wire extend through the opening and at least one of the first wire and the second wire carries current,
the hardware processor is further configured to derive a measure of in the second wire based on the constants.

17. The apparatus according to claim 16, wherein the hardware processor is further configured to determine, based on the constants, at least one of:
a location of the first wire within the opening, and
a location of the second wire within the opening.

18. The apparatus according to claim 16, wherein the apparatus further includes a display unit configured to display a graphical representation of at least one of:
the measure of current in the second wire, and
the measure of current in the first wire derived by the hardware processor.

19. The apparatus according to claim 1, wherein the plurality of constants includes 2K constants when the at least one wire includes K wires, where K is an integer equal to or greater than 1.

20. The apparatus according to claim 19, wherein:
the plurality of magnetic sensor pairs arranged along the contour with respect to a common reference point,
the 2K constants are constants $A_0$ through $A_{2K-1}$, and
a constant $A_n$ of the 2K constants is computed based on an integral $\varphi z^{n-1} M(z) R(z) dz$, where:
n is an integer between 0 and $2K-1$,
z is an integration variable on the contour,
M(z) is a magnetic field based on the signals generated by the two or more of the plurality of magnetic sensor pairs, and
R(z) is a distance from a point z on the contour to the common reference point.

21. A method for operating an apparatus for measuring current flow through a wire, the method comprising:
enclosing the wire within an opening in a housing of the apparatus so that the wire extends through the opening, where the opening is for receiving one or more wires and the housing includes a plurality of magnetic sensor pairs arranged along a contour within or on the housing;
using a hardware processor of the apparatus to receive signals generated by the plurality of magnetic sensor pairs while the wire is enclosed within the opening and is carrying current, wherein the signals generated by each magnetic sensor pair of the plurality of magnetic sensor pairs include
a first signal indicative of a magnetic field in a first direction, and
a second signal indicative of a magnetic field in a second direction; and
using the hardware processor to:
compute a plurality of constants related to integrals around the contour, where the constants are computed based on the signals generated by two or more of the plurality of magnetic sensor pairs, and
derive a measure of the current in the wire based on the constants.

22. A method for determining current in a wire, the method comprising:
causing a plurality of magnetic sensor pairs arranged along a contour within a housing having an opening for receiving one or more wires to generate signals when the wire extends through the opening and is carrying current, the signals from each magnetic sensor pair including:
a first signal indicative of a magnetic field in a first direction, and
a second signal indicative of a magnetic field in a second direction; and
using a hardware processor to:
compute a plurality of constants related to integrals around the contour, where the constants are computed based on the signals generated by two or more of the plurality of magnetic sensor pairs, and
derive a measure of the current in the wire based on the constants.

23. An apparatus for measuring current flow through a cable, the apparatus comprising:
a receiver interface, configured to receive outputs from first magnetic sensors and second magnetic sensors, where:
the first magnetic sensors and the second magnetic sensors are arranged in a housing along a contour around an opening in the housing,
the opening is an opening in which the cable having one or more conductors is to be placed,
the first magnetic sensors are configured to generate outputs indicative of a magnetic field strength in a first direction when the cable is placed in the opening, and
the second magnetic sensors are configured to generate outputs indicative of a magnetic field strength in a second direction when the cable is placed in the opening; and
a processor logic, configured to:
compute a plurality of constants related to integrals around the contour, where the constants are computed based on the outputs from the first magnetic sensors and the second magnetic sensors, and
determine a current in at least one conductor of the cable based on the constants.

24. The apparatus according to claim 23, wherein the first direction is substantially orthogonal to the second direction.

25. The apparatus according to claim 23, wherein the first magnetic sensors comprise four magnetic sensors, and wherein the four magnetic sensors are disposed in a Wheatstone bridge configuration.

* * * * *

UNITED STATES PATENT AND TRADEMARK OFFICE
CERTIFICATE OF CORRECTION

PATENT NO. : 10,712,369 B2
APPLICATION NO. : 16/003701
DATED : July 14, 2020
INVENTOR(S) : Boris Lerner et al.

Page 1 of 1

It is certified that error appears in the above-identified patent and that said Letters Patent is hereby corrected as shown below:

On the Title Page

Item (54) and in the Specification, Column 1, Lines 1-3, delete "CURRENT MEASUREMENT USING MAGNETIC SENSORS AND CONTOUR INTERVALS" and insert -- "CURRENT MEASUREMENT USING MAGNETIC SENSORS AND CONTOUR INTEGRALS" --.

Signed and Sealed this
Twenty-fifth Day of August, 2020

Andrei Iancu
*Director of the United States Patent and Trademark Office*